(12) United States Patent
Kim et al.

(10) Patent No.: US 9,673,106 B2
(45) Date of Patent: Jun. 6, 2017

(54) SEMICONDUCTOR DEVICES AND METHODS OF MANUFACTURING THE SAME

(71) Applicant: SAMSUNG ELECTRONICS CO., LTD., Suwon-si, Gyeonggi-do (KR)

(72) Inventors: So-Yeon Kim, Busan (KR); Yuri Masuoka, Seongnam-si (KR)

(73) Assignee: SAMSUNG ELECTRONICS CO., LTD., Suwon-Si, Gyeonggi-Do (KR)

(*) Notice: Subject to any disclaimer, the term of this patent is extended or adjusted under 35 U.S.C. 154(b) by 0 days.

(21) Appl. No.: 14/956,522

(22) Filed: Dec. 2, 2015

(65) Prior Publication Data

US 2016/0163799 A1   Jun. 9, 2016

(30) Foreign Application Priority Data

Dec. 4, 2014  (KR) .................... 10-2014-0172672

(51) Int. Cl.
| | | |
|---|---|---|
| H01L 29/423 | (2006.01) | |
| H01L 21/8238 | (2006.01) | |
| H01L 21/84 | (2006.01) | |
| H01L 27/092 | (2006.01) | |
| H01L 27/12 | (2006.01) | |

(52) U.S. Cl.
CPC .... *H01L 21/823821* (2013.01); *H01L 21/845* (2013.01); *H01L 27/0924* (2013.01); *H01L 27/1211* (2013.01)

(58) Field of Classification Search
CPC ........... H01L 21/28273; H01L 29/4238; H01L 29/42392
See application file for complete search history.

(56) References Cited

U.S. PATENT DOCUMENTS

| | | |
|---|---|---|
| 6,514,827 B2 | 2/2003 | Kim et al. |
| 6,952,113 B2 | 10/2005 | Brown et al. |
| 7,078,278 B2 | 7/2006 | Pan et al. |
| 7,274,217 B2 | 9/2007 | Chuang et al. |
| 7,776,680 B2 | 8/2010 | Basker et al. |
| 7,800,186 B2 | 9/2010 | Park et al. |
| 8,013,368 B2 | 9/2011 | Bohr |
| 8,748,246 B2 | 6/2014 | Ramin et al. |
| 2008/0278194 A1* | 11/2008 | Kamo ............... H03K 19/0008 326/33 |

(Continued)

FOREIGN PATENT DOCUMENTS

KR   10-2002-0049350 A   6/2002

*Primary Examiner* — Thomas L Dickey

(74) *Attorney, Agent, or Firm* — Lee & Morse P.C.

(57) ABSTRACT

A semiconductor device includes a substrate including an active fin and an isolation layer thereon, a first gate structure on the active fin, the first gate structure including a first gate insulation layer pattern and a first metal pattern, and the first metal pattern having a first conductivity type and directly contacting the first gate insulation layer pattern, a first channel region at a portion of the active fin facing a bottom surface of the first gate structure, the first channel region including impurities having the first conductivity type, and first source/drain regions at upper portions of the active fin adjacent to opposite sidewalls of the first gate structure, the first source/drain regions including impurities having a second conductivity type different from the first conductivity type.

20 Claims, 32 Drawing Sheets

(56) References Cited

U.S. PATENT DOCUMENTS

2010/0317181 A1\* 12/2010 Chung ............ H01L 21/823821
                                                            438/585
2013/0105906 A1   5/2013  Yin et al.
2013/0140641 A1   6/2013  Chuang et al.
2014/0015063 A1   1/2014  Yang et al.

\* cited by examiner

SEMICONDUCTOR DEVICES AND METHODS OF MANUFACTURING THE SAME

CROSS-REFERENCE TO RELATED APPLICATION

Korean Patent Application No. 10-2014-0172672, filed on Dec. 4, 2014, in the Korean Intellectual Property Office, and entitled: "Semiconductor Devices and Methods of Manufacturing the Same," is incorporated by reference herein in its entirety.

BACKGROUND

1. Field

Example embodiments relate to semiconductor devices and methods of manufacturing the same. More particularly, example embodiments relate to semiconductor devices including transistors and methods of manufacturing the same.

2. Description of the Related Art

Transistors in a semiconductor device need to have operation characteristics required by users. The transistors in the semiconductor device need to have various threshold voltages.

SUMMARY

According to example embodiments, a semiconductor device includes a substrate including an active fin and an isolation layer thereon, a first gate structure on the active fin, the first gate structure including a first gate insulation layer pattern and a first metal pattern, and the first metal pattern having a first conductivity type and directly contacting the first gate insulation layer pattern, a first channel region at a portion of the active fin facing a bottom surface of the first gate structure, the first channel region including impurities having the first conductivity type, and first source/drain regions at upper portions of the active fin adjacent to opposite sidewalls of the first gate structure, the first source/drain regions including impurities having a second conductivity type different from the first conductivity type.

In example embodiments, logic circuits further may include second transistors on a region of the substrate, wherein each of the second transistors may include a second gate structure on the active fin, the second gate structure including the first gate insulation layer pattern and a second metal pattern, and the second metal pattern having a third conductivity type and directly contacting the first insulation layer pattern, a second channel region at a portion of the active fin facing a bottom surface of the second gate structure, the second channel region being doped with impurities having a fourth conductivity type different from the third conductivity type and second source/drain regions at upper portions of the active fin adjacent to both sidewalls of the second gate structure, the second source/drain regions being doped with impurities having the third conductivity type.

In example embodiments, the first gate structure, the first channel region and the first source/drain regions may form a first transistor, and wherein the first transistor may be electrically connected to an input part of the logic circuits including the second transistors so that the first transistor serves as a header transistor for switching the logic circuits.

In example embodiments, the first transistor may include the first gate structure, the first channel region, and the first source/drain regions, wherein the first gate structure may contain the first metal pattern having a n-type conductivity, the first channel region may have a n-type conductivity, and the first source/drain regions may have p-type conductivities, and wherein the first transistor may be a PMOS transistor.

In example embodiments, the first gate structure, the first channel region and the first source/drain regions may form a first transistor, and wherein the first transistor may be electrically connected to an output part of the logic circuits including the second transistors so that the first transistor may serve as a footer transistor for switching the logic circuits.

In example embodiments, the first transistor may include the first gate structure, the first channel region, and the first source/drain regions, wherein the first gate structure may contain the first metal pattern having a p-type conductivity, the first channel region may have a p-type conductivity, and the first source/drain regions may have n-type conductivities, and wherein the first transistor may be an NMOS transistor.

In example embodiments, the second source/drain regions of the second transistor may be formed in a semiconductor pattern formed by an epitaxial growth process.

In example embodiments, the first gate insulation layer pattern and the first metal pattern may have a cylindrical shape.

In example embodiments, the first gate structure may further include an upper metal pattern filling an inner space of the first metal pattern on the first metal pattern.

In example embodiments, the first gate insulation layer pattern may include a silicon oxide layer pattern and a metal oxide layer pattern sequentially stacked.

In example embodiments, wherein the first gate structure may have a gate length of about 10 nm to about 50 nm.

According to example embodiments, there is provided a semiconductor device. The semiconductor device includes a substrate including an active fin and an isolation layer pattern thereon, the substrate being divided into first and second regions, a first transistor on the active fin of the first region, the first transistor including a first gate structure and a channel region, the first gate structure containing a first gate insulation layer pattern and a first metal pattern, and each of the first metal pattern and the channel region having a first conductivity type, a second NMOS transistor on the active fin of the second region, the second NMOS transistor including a second gate structure containing the first gate insulation layer pattern and a second metal pattern, the second metal pattern having a n-type metal and a second PMOS transistor on the active fin of the second region, the second PMOS transistor including a third gate structure containing the first gate insulation layer pattern and a third metal pattern, the third metal pattern having a p-type metal.

In example embodiments, the first transistor may be electrically connected to an input part of logic circuits including the second NMOS and PMOS transistors so that the first transistor serves as a header transistor for switching the logic circuits.

In example embodiments, the first transistor may include the first gate structure, the channel region, and source/drain regions, wherein the first gate structure contains the first metal pattern having a n-type conductivity, the channel region has a n-type conductivity, and the source/drain regions may have p-type conductivities, and wherein the first transistor may be a PMOS transistor.

In example embodiments, the first transistor is electrically connected to an output part of the logic circuits including the second NMOS and PMOS transistors so that the first transistor serves as a footer transistor for switching the logic circuits.

In example embodiments, wherein the first transistor may include the first gate structure, the channel region, and the source/drain regions, wherein the first gate structure may contain the first metal pattern having a p-type conductivity, the channel region may have a p-type conductivity, and the source/drain regions have n-type conductivities, and wherein the first transistor may be an NMOS transistor.

According to example embodiments, there is provided a method of manufacturing a semiconductor device. In the method, an active fin and isolation layer pattern is formed on a substrate. A mold pattern is formed on the substrate, the mold pattern has an opening therein and the opening exposing a top surface of the active fin. A first gate insulation layer and a first metal layer is formed on the exposed top surface of the active fin, a sidewall of the opening and the mold pattern, and the first metal layer includes a metal having a first conductivity type. A portion of the metal layer on a first region of the substrate and a portion of the metal layer on a second region of the substrate are removed, the second region is region for forming a transistor of a second conductivity type different from the first conductivity type. A second metal layer is formed on the first metal layer and the first gate insulation layer, the second metal layer includes a metal having the second conductivity type. The first gate insulation layer and the second metal layer are planarized to form first, second and third transistors. The first transistor of the first conductivity type is formed on the active fin of the first region of the substrate, the second transistor of the first conductivity type is formed on the active fin of the second region of the substrate, the third transistor of the second conductivity type is formed on the active fin of the second region of the substrate. The first transistor includes a metal having the second conductivity type, the second transistor includes a metal having the first conductivity type, and the third transistor includes a metal having the second conductivity type.

In example embodiments, the second conductivity type impurities may be implanted into the active fin of the first region of the substrate and a portion of the second region of the substrate for forming the second transistor to form channel regions having the second conductivity type at portions of the first and second regions of the substrate, respectively. The first conductivity type impurities may be implanted into a portion of the second region of the substrate for forming the third transistor to form channel regions having the first conductivity type.

In example embodiments, prior to removing the portion of the metal layer on the first region of the substrate and the portion of the metal layer on the second region of the substrate, a photoresist pattern covering the second transistors may be further formed on the second region of the substrate.

In example embodiments, impurity regions may be further formed at upper portions of the active fin adjacent to the opening, the impurity regions serving as source/drain regions.

In example embodiments, prior to forming the impurity regions, a portion for forming the impurity regions of the active fin of the second region of the substrate may be etched to form a recess. A semiconductor pattern may be formed in the recess by a selective epitaxial growth process.

In example embodiments, the first gate insulation layer may be formed to include a silicon oxide layer and a metal oxide layer sequentially stacked.

In example embodiments, a third metal layer may be further formed on the second metal layer to fill the opening.

According to example embodiments, there is provided a semiconductor device, including a substrate including an active fin and an isolation layer thereon, a first gate structure on the active fin, the first gate structure including a first gate insulation layer pattern and a first metal pattern, and the first metal pattern having a first conductivity type and directly contacting the first gate insulation layer pattern, a first channel region in the active fin, the first channel region including impurities having the first conductivity type, and first source/drain regions in upper portions of the active fin at opposite sides of the first gate structure, the first source/drain regions having a non-overlapping relationship with the first gate structure and including impurities having a second conductivity type different from the first conductivity type.

An entirety of a bottom of the first gate structure may face and overlaps the first channel region.

The semiconductor device may further include logic circuits electrically connected to a transistor having the first gate structure, the first channel region, and the first source/drain region, the transistor having a higher threshold voltage than the logic circuits.

The first gate insulation layer pattern may include a silicon oxide layer pattern and a metal oxide layer pattern sequentially stacked on the active fin, the first metal pattern directly contacting the metal oxide layer pattern.

The first metal pattern may separate the metal oxide layer pattern from a gate pattern of the first gate structure.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
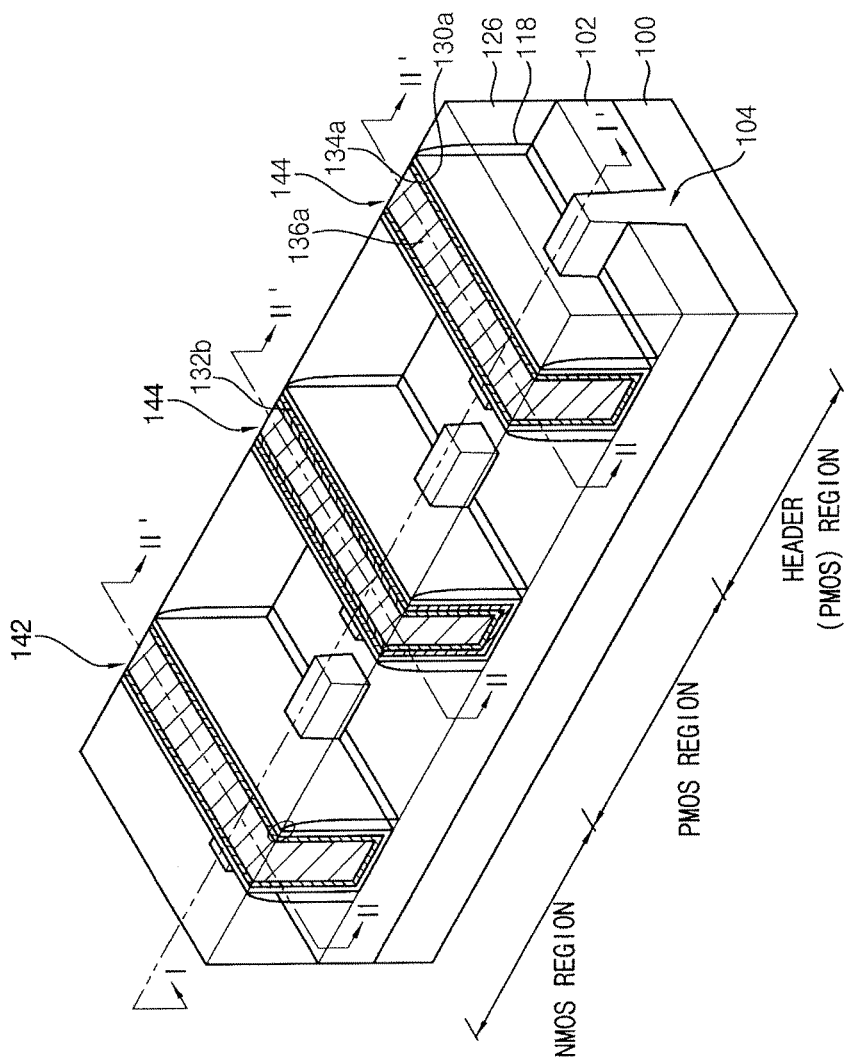
FIGS. 1 to 3 illustrate a perspective view and cross-sectional views of a semiconductor device in accordance with example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present disclosure.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
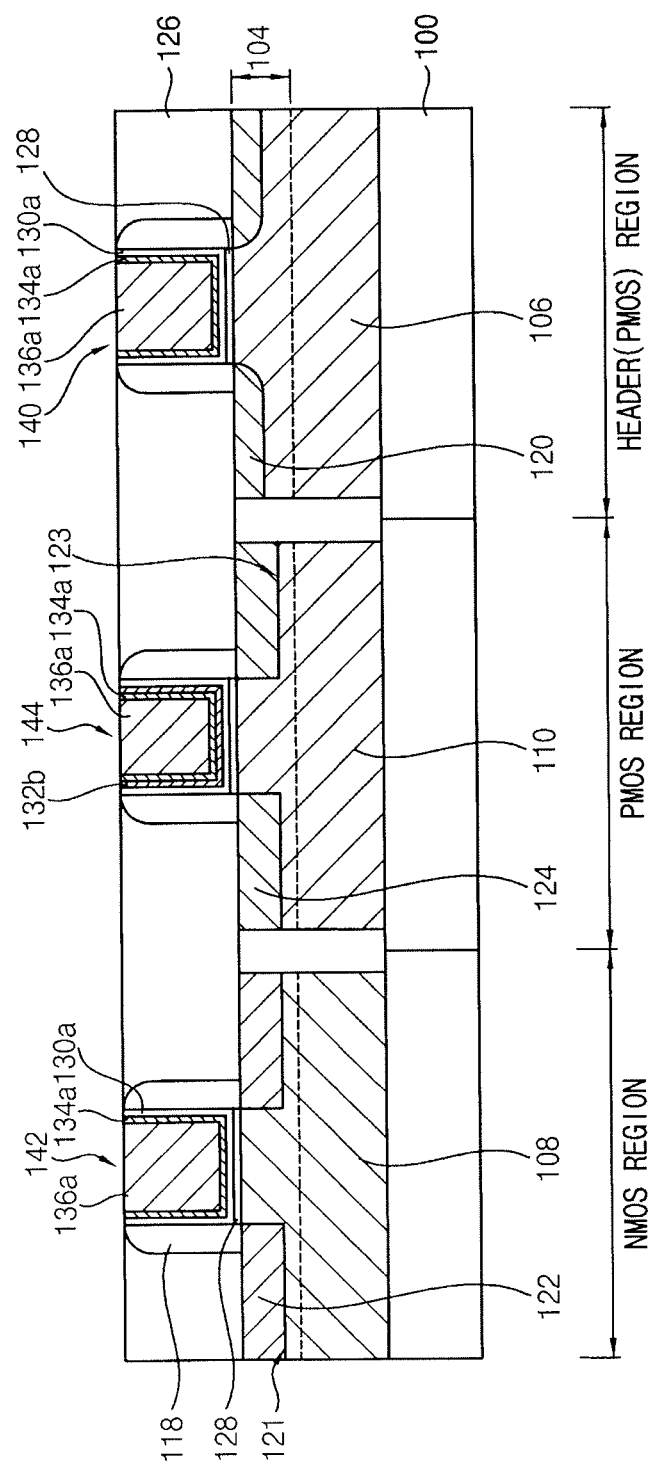
Figure 3:
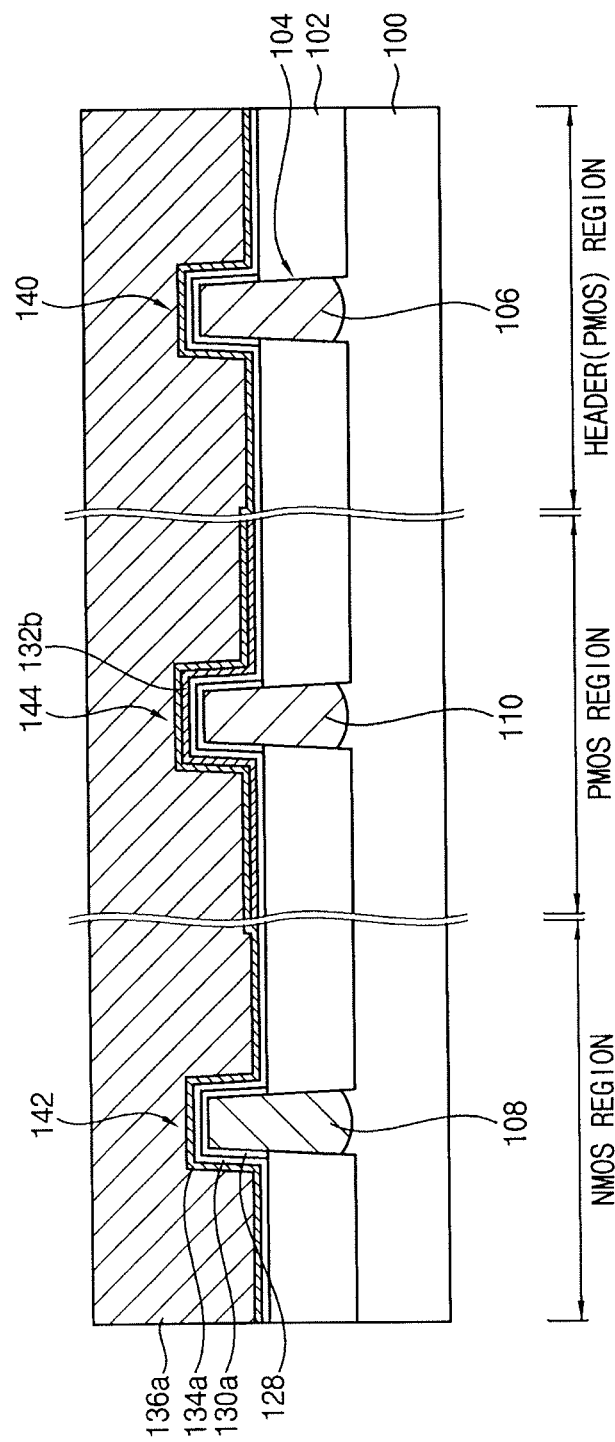
Figure 4:
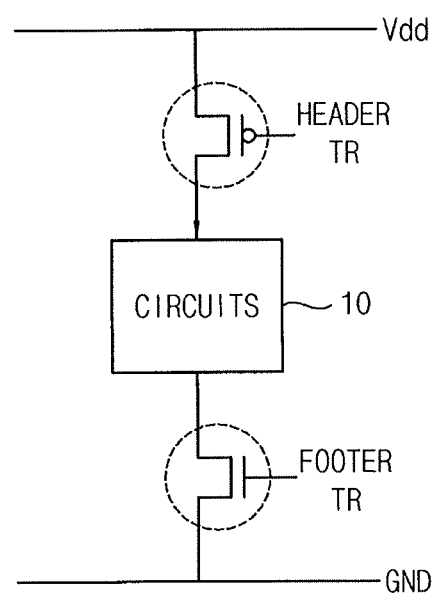
FIG. 4 illustrates a circuit diagram of transistors in the semiconductor.

FIGS. 1 to 3 are a perspective view and cross-sectional views illustrating a semiconductor device in accordance with example embodiments. FIG. 4 is a circuit diagram illustrating transistors in the semiconductor. FIG. 2 shows a cross-sectional view along line I-I' of FIG. 1, and FIG. 3 shows cross-sectional views along lines respectively, of FIG. 1.

Referring to FIG. 4, logic circuits including NMOS and PMOS transistors may be formed on a logic region 10 of the semiconductor device. A header transistor for switching the logic circuits may be formed at an input part of the logic circuits. The header transistor may be electrically connected to a source voltage Vdd. A footer transistor for switching the logic circuits may be formed at an output part of the logic circuits. In example embodiments, the semiconductor device may include at least one of the header and footer transistors.

In example embodiments, the header transistor may include a PMOS transistor. The header transistor may have a threshold voltage higher than those of NMOS and PMOS transistors in the logic circuits, and may have low stand-by currents and low leakage currents. In example embodiments, the footer transistor may include a NMOS transistor. The footer transistor may have a threshold voltage higher than those of NMOS and PMOS transistors in the logic circuits, and may have low stand-by currents and low leakage currents.

Hereinafter, only the semiconductor device including the header transistor will be illustrated.

Referring to FIGS. 1 to 3, a substrate 100 may include a header region, a NMOS region, and a PMOS region. A first transistor may be formed on the header region and may serve as a header transistor. Second and third transistors may be formed on the NMOS and PMOS regions, respectively, and may serve as logic circuits. Each of the first and third transistors may be a PMOS transistor, and the second transistor may be a NMOS transistor.

The substrate 100 may be, e.g., a silicon substrate, a germanium substrate, a silicon-germanium substrate, a silicon-on-insulator (SOI) substrate, a germanium-on-insulator (GOI) substrate, etc. The substrate 100 may be divided into a field region, on which an isolation layer 102 is formed, and an active region, on which no isolation layer is formed. The active region may have a fin-like shape protruding from the field region, and thus the active region may be referred to as an active fin 104.

The isolation layer 102 may include an oxide, e.g., silicon oxide. The substrate 100 may be partially etched to form the active fin 104 so that a material of the active fin 104 may be substantially the same as that of the substrate 100.

The first transistor may include a first gate structure 140, a first channel region 106, and first source/drain regions 120.

The first gate structure 140 may be formed on the active fin 104 of the header region. The first gate structure 140 may include an oxide layer pattern 128, a high-k dielectric layer pattern 130a, a first n-type metal pattern 134a, and a gate pattern 136a. The first channel region 106 may be formed at a portion of the active fin 104 facing a bottom surface of the first gate structure 140. The first channel region 106 may be doped with n-type impurities, e.g., phosphorus, arsenic, etc. The first source/drain regions 120 may be formed at upper portions of the active fin 104 adjacent to the first gate structure 140, and may be doped with p-type impurities, e.g., boron. That is, the first metal pattern 134a directly contacting the high-k dielectric layer pattern 130a of the first transistor may have a same n-type conductivity as that of the first channel region 106.

The oxide pattern 128 may include silicon oxide formed by a thermal oxidation process. The high-k dielectric layer pattern 130a may include a metal oxide having a high dielectric constant higher than that of silicon nitride. The high-k dielectric layer pattern 130a may include, e.g., hafnium oxide, tantalum oxide, zirconium oxide, etc.

The first n-type metal pattern 134a may include a metal having a Fermi level near a conduction band of silicon. That is, the first n-type metal pattern 134a may include a metal having a work function less than about 4.5 eV. The first n-type metal pattern 134a may include, e.g., Ti, Ag, Al, TiAl, TiAlN, TaC, TaCN, TaSiaN, Mn, Zr, etc.

The gate pattern 136a may include a metal having a low resistance, e.g., aluminum, copper, tantalum, etc.

The second transistor may include a second gate structure 142, a second channel region 108, and second source/drain regions 122.

The second gate structure 142 may be formed on the active fin 104 of the NMOS region. The second gate structure 142 may include the oxide layer pattern 128, the high-k dielectric layer pattern 130a, the first n-type metal pattern 134a, and the gate pattern 136a. That is, the second gate structure 142 may have a stacked structure substantially the same as that of the first gate structure 140. The second channel region 108 may be formed at a portion of the active fin facing a bottom surface of the second gate structure 142. The second channel region 108 may be doped with p-type impurities, e.g., boron. The second source/drain regions 122 may be formed at upper portions of the active fin 104 adjacent to the second gate structure 142, and may be doped with n-type impurities, e.g., phosphorus, arsenic, etc. That is, the first metal pattern 134a directly contacting the high-k dielectric layer pattern 130a of the second transistor may have a n-type conductivity different from that of the second channel region 108.

In example embodiments, a first semiconductor pattern may be formed in a first recess 121 on an upper portion of the active fin 104 adjacent to the second gate structure 142. The first semiconductor pattern may include silicon formed by a selective epitaxial growth process. The second source/drain regions 122 may be formed in the first semiconductor pattern.

The third transistor may include a third gate structure 144, a third channel region 110, and third source/drain regions 124.

The third gate structure 144 may include the oxide layer pattern 128, the high-k dielectric layer pattern 130a, a first p-type metal pattern 132b, the first n-type metal pattern 134a, and the gate pattern 136a. The third gate structure 144 may be formed on the active fin 104 of the PMOS region. That is, the third gate structure 144 may have a stacked structure different from that of the first gate structure 140.

The third channel region 110 may be formed at a portion of the active fin 104 facing a bottom surface of the third gate structure 144. The third channel region 110 may be doped with n-type impurities, e.g., phosphorus, arsenic, etc. The third source/drain regions 124 may be formed at upper portions of the active fin 104 adjacent to the third gate structure 144, and may be doped with p-type impurities, e.g., boron. That is, the first metal pattern 132b directly contacting the high-k dielectric layer pattern 130a of the third transistor may have a p-type conductivity different from that of the third channel region 110.

The first p-type metal pattern 132b may include a metal having a Fermi level near a valance band of silicon. That is, the first p-type metal pattern 132b may include a metal having a work function more than about 4.5 eV. The first p-type metal pattern 132b may include, e.g., TiN, WN, TaN, Ru, etc.

In example embodiments, a second semiconductor pattern may be formed in a second recess 123 on an upper portion of the active fin 104 adjacent to the third gate structure 144. The second semiconductor pattern may include silicon germanium formed by a selective epitaxial growth process. The third source/drain regions 124 may be formed in the second semiconductor pattern.

Spacers 118 may be formed on sidewalls of each of the first to third gate structures 140, 142 and 144.

Each of the first and third transistors may have a p-type conductivity. However, stacked structures of the first and third gate structures 140 and 144 may be different from each other. That is, the header transistor and the PMOS transistor of the logic circuits may have different gate stacked structures.

Accordingly, as the first n-type metal pattern 134a directly contacting the high-k dielectric layer pattern 130a and the first channel region 106 may have the same conductivity type, a threshold voltage of the first transistor may increase. That is, an absolute value of the threshold voltage of the first transistor may be higher than that of a threshold voltage of the third transistor.

In example embodiments, each of the first to third transistors may be a fin-type transistor. Each of the first to third gate structures 140, 142, and 144 may have a critical dimension less than about 50 nm. That is, each of the first to third transistors 140, 142, and 144 may have a gate length less than about 50 nm, e.g., 10 nm to 50 nm.

If a transistor is a planar type transistor, a threshold voltage of the transistor may be higher than the source voltage, as the first n-type metal pattern contacting the high-k dielectric layer pattern and the first channel region have the same conductivity type. Thus, the planar type transistor may not perform a switching operation. If the gate length of the first transistor is more than about 50 nm, a horizontal area of the planar transistor may increase and an integration degree of the semiconductor device may decrease.

The first and third transistors may be fin-type transistors and the gate length of each of the first and third transistors may be less than about 50 nm. Thus, a difference between the threshold voltages of the first and third transistors may be less than about 0.4V. Also, the threshold voltage of the first transistor may be lower than the source voltage so that the first transistor may serve as the header transistor.

For example, an absolute value of the threshold voltage of the first transistor may be higher than that of the threshold voltage of the third transistor by 0.2 V to 0.4 V. Also, the absolute value of the threshold voltage of the first transistor may be lower than about 1.5 V. Thus, when the source voltage is less than about 1.5 V, the first transistor may serve as the header transistor.

Figure 5:
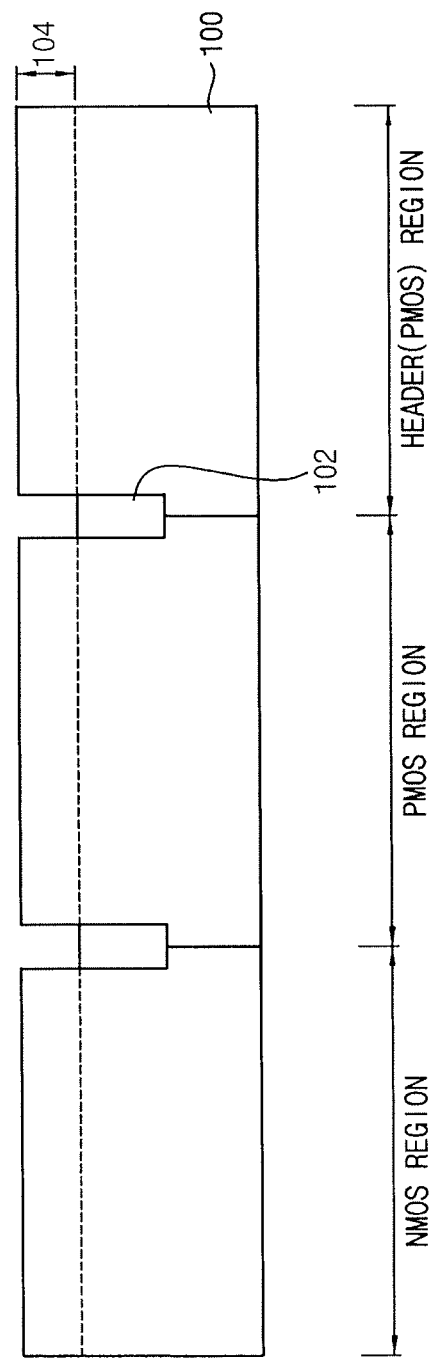
FIGS. 5 to 22 illustrate a perspective view and cross-sectional views of stages in a method of manufacturing a semiconductor device in accordance with example embodiments.
Figure 6:
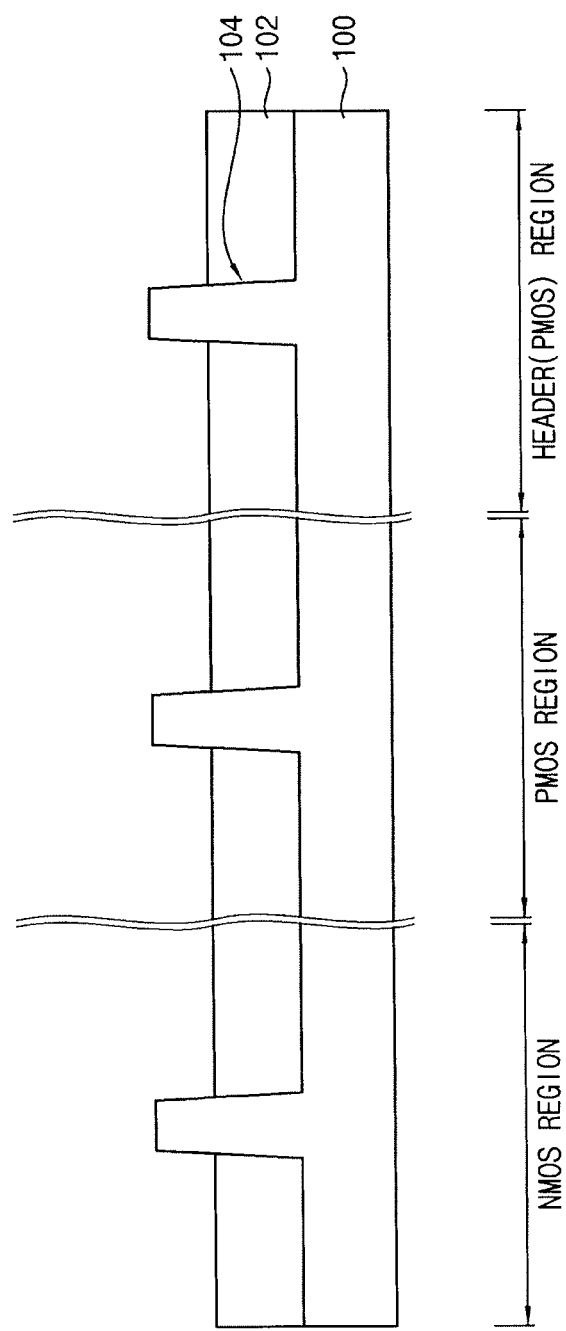
Figure 7:
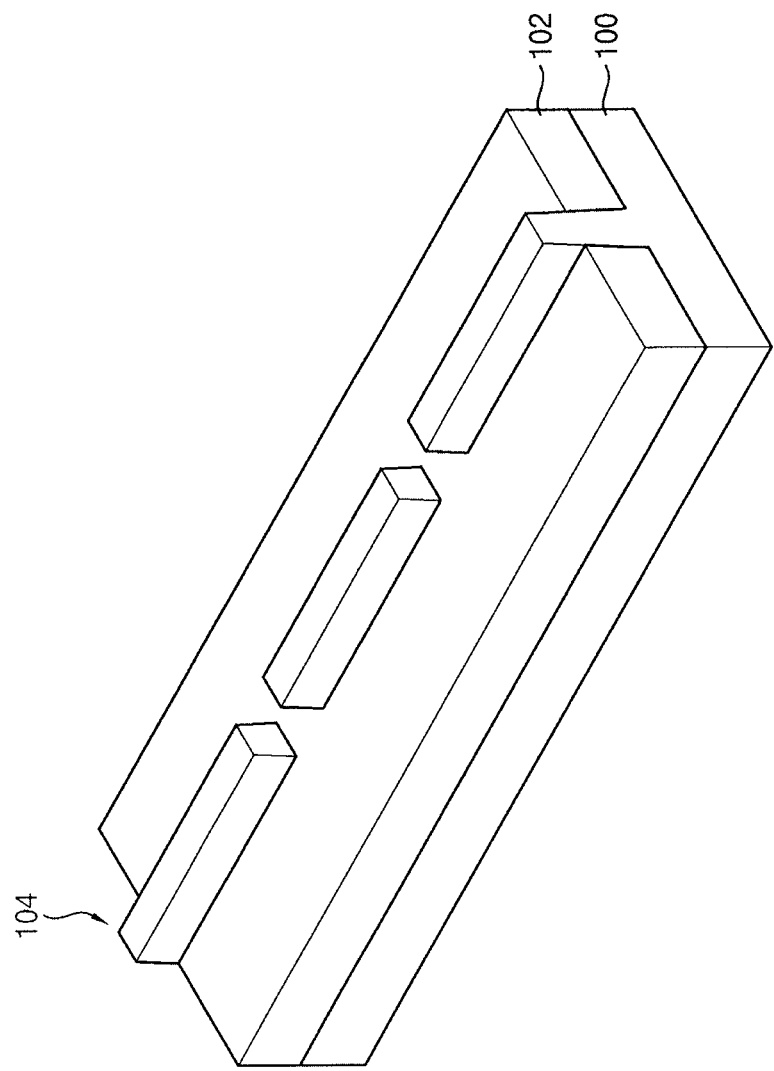

FIGS. 5 to 22 are a perspective view and cross-sectional views of stages in a method of manufacturing a semiconductor device in accordance with example embodiments Referring to FIGS. 5 to 7, the substrate 100 may be partially etched to form a trench, and the isolation layer 102 may be formed in a lower portion of the trench. The substrate 100 may include the header region on which the header transistor is formed, and the NMOS region and the PMOS region on which logic circuits are formed. The NMOS transistor may be formed on the NMOS region, and the PMOS transistor may be formed on the PMOS region.

The substrate 100 may be, e.g., a silicon substrate, a germanium substrate, a silicon-germanium substrate, a silicon-on-insulator (SOI) substrate, a germanium-on-insulator (GOI) substrate, etc. An insulation layer may be formed on the substrate 100 to fill the trench, and the insulation layer may be planarized until a top surface of the substrate 100 may be exposed. Also, an upper portion of the insulation layer may be removed to expose an upper sidewall of the trench, and thus the isolation layer 102 may be formed. The insulation layer may include an oxide, e.g., silicon oxide. Thus, the isolation layer 102 and an active fin 104 protruding from the isolation layer 102 may be formed on the substrate 100.

Figure 8:
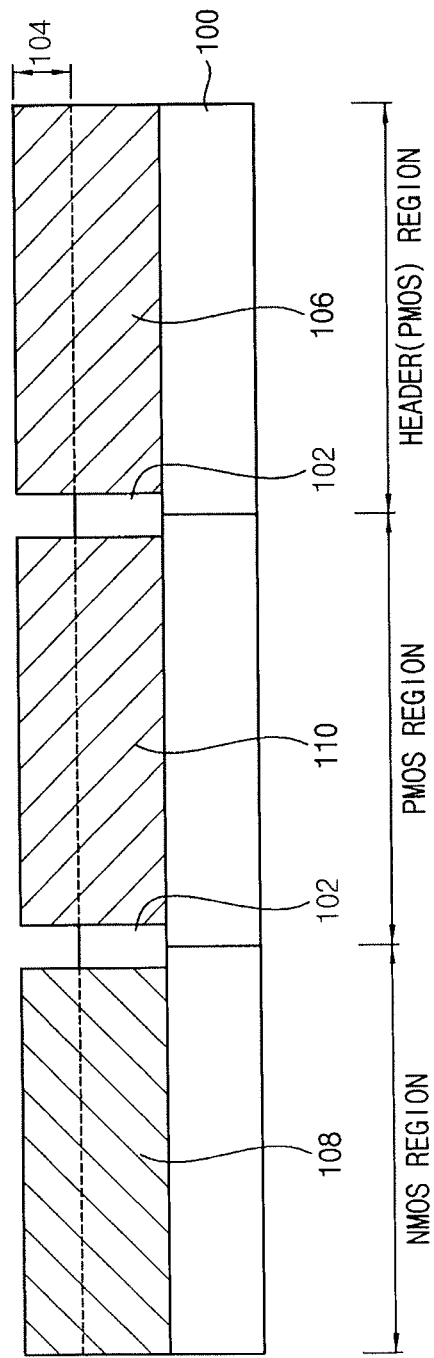
Figure 9:
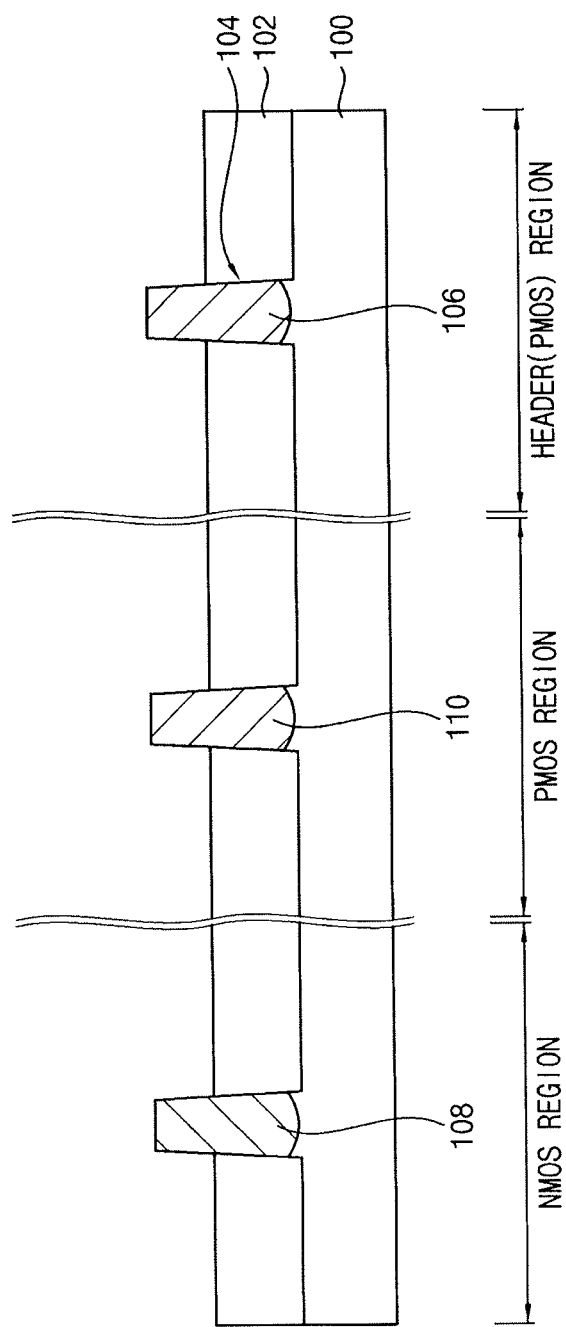

Referring to FIGS. 8 and 9, impurities may be doped into the active fin 104 of the header region and the NMOS and PMOS regions to form first to third channel regions 106, 108 and 110, respectively. In example embodiments, PMOS transistors may be formed on the header region and PMOS region, and thus the first and third channel regions 106 and 110 may be doped with n-type impurities. Also, an NMOS transistor may be formed on the NMOS region, and thus the second channel region 108 may be doped with p-type impurities.

Figure 10:
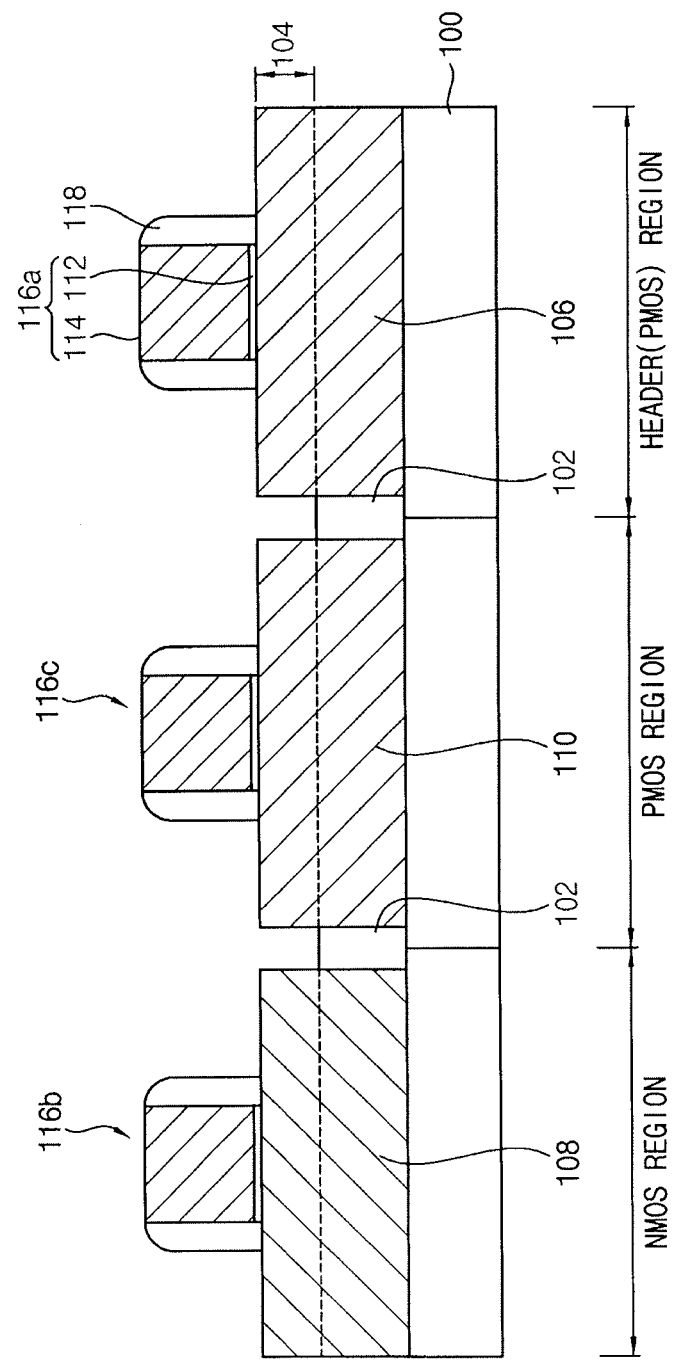
Figure 11:
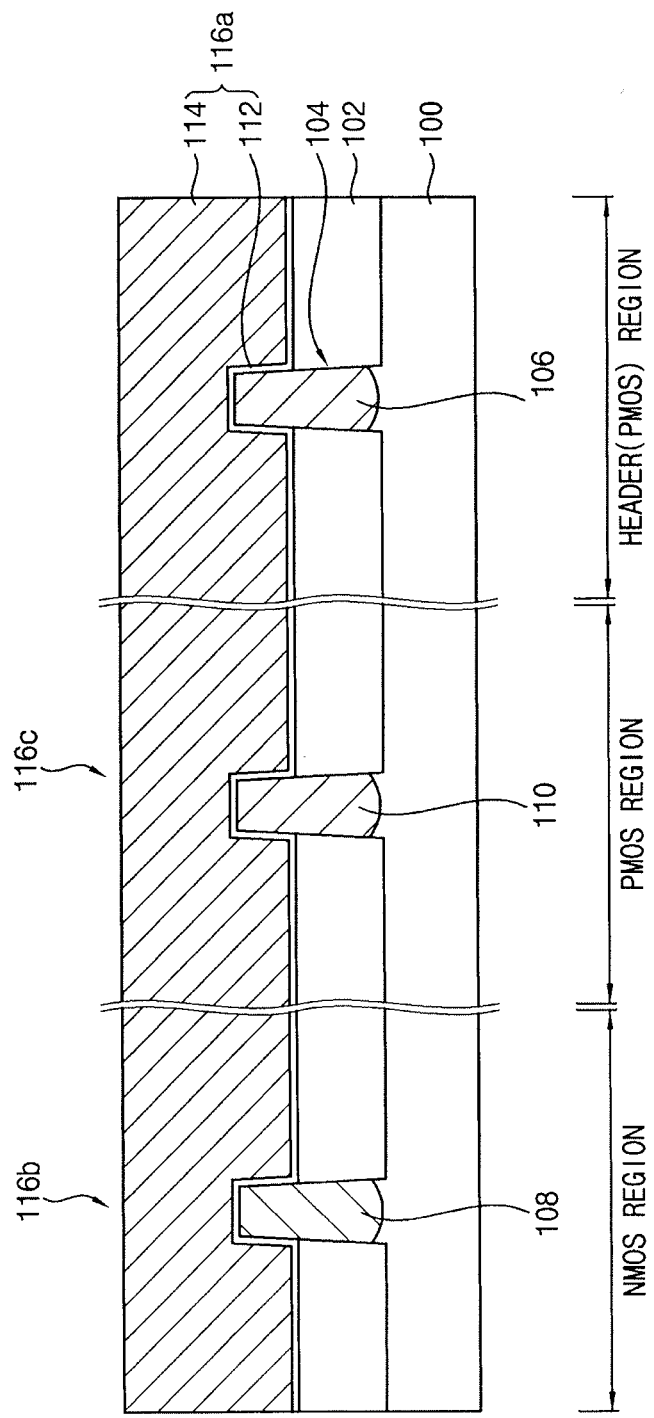

Referring to FIGS. 10 and 11, first to third dummy gate structures 116a, 116b and 116c may be formed on the active fin 104 of the header region, the NMOS region, and the PMOS region, respectively. Particularly, a dummy gate insulation layer and a dummy gate electrode layer may be formed on the substrate 100. An etching mask (not shown) may be formed on the dummy gate electrode layer, and the dummy gate insulation layer and the dummy gate electrode layer may be etched using the etching mask to form the first to third dummy gate structures 116a, 116b and 116c. Thus, each of the first to third dummy gate structures 116a, 116b, and 116c may be formed to include a gate insulation layer pattern 112, a dummy gate electrode 114, and the mask sequentially stacked.

The dummy gate insulation layer may be formed to include an oxide, e.g., silicon oxide, the dummy gate electrode layer may be formed to include, e.g., polysilicon, and the mask may be formed to include a nitride, e.g., silicon nitride. Each of the first to third dummy gate structures 116a, 116b, and 116c may be formed to have a critical dimension less than about 50 nm.

In example embodiments, a gate spacer 118 may be formed on a sidewall of each of the first to third dummy gate structures 116a, 116b, and 116c. The gate spacer 116 may be formed by forming a spacer layer on the substrate 100 to cover the first to third dummy gate structures 116a, 116b, and 116c, and anisotropically etching the spacer layer.

Figure 12:
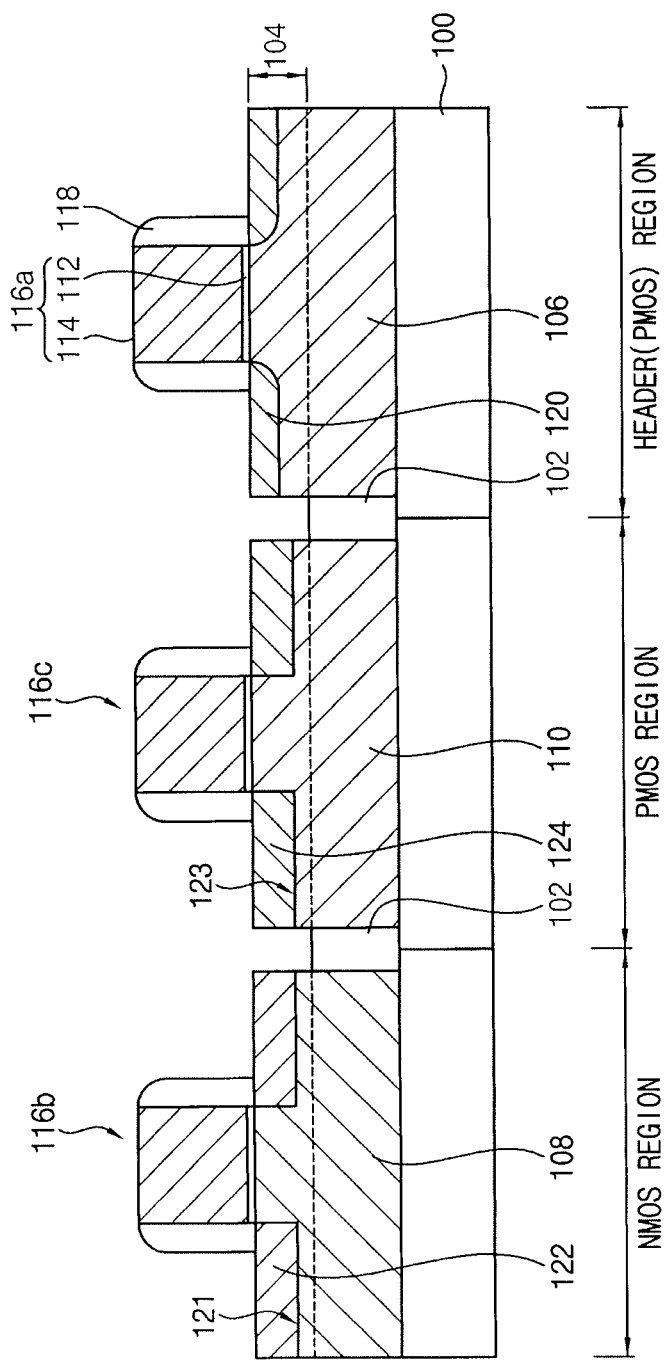

Referring to FIG. 12, first and second semiconductor patterns may be formed on the active fin 104 of the NMOS and PMOS regions by selective epitaxial growth processes.

Particularly, the first recess 121 may be formed by partially etching upper portions of the active fin 104 adjacent to the second dummy gate structure 116b, and the first semiconductor patterns including silicon may be formed in the first opening 121 by a selective epitaxial growth process. The second recess 123 may be formed by partially etching upper portions of the active fin 104 adjacent to the third dummy gate structure 116c, and the second semiconductor patterns including silicon germanium may be formed in the second opening 123 by a selective epitaxial growth process.

According to the formation of the first and second semiconductor patterns, stresses may be applied to the second and third channel regions 108 and 110. Thus, a charge mobility of the NMOS and PMOS transistors may increase.

Impurities may be doped onto the active fin 104 adjacent to the first to third dummy gate structures 116a, 116b, and 116c to form first to third source/drain regions 120, 122, and 124, respectively.

In example embodiments, p-type impurities may be doped into the active fin 104 of the header region and the PMOS region. Thus, the first source/drain regions 120 may be formed in the active fin 104 adjacent to the first dummy gate structure 116a, and the third source/drain regions 124 may be formed in the second semiconductor pattern. Further, n-type impurities may be doped into the NMOS region so that the second source/drain regions 122 may be formed in the first semiconductor pattern.

Figure 13:
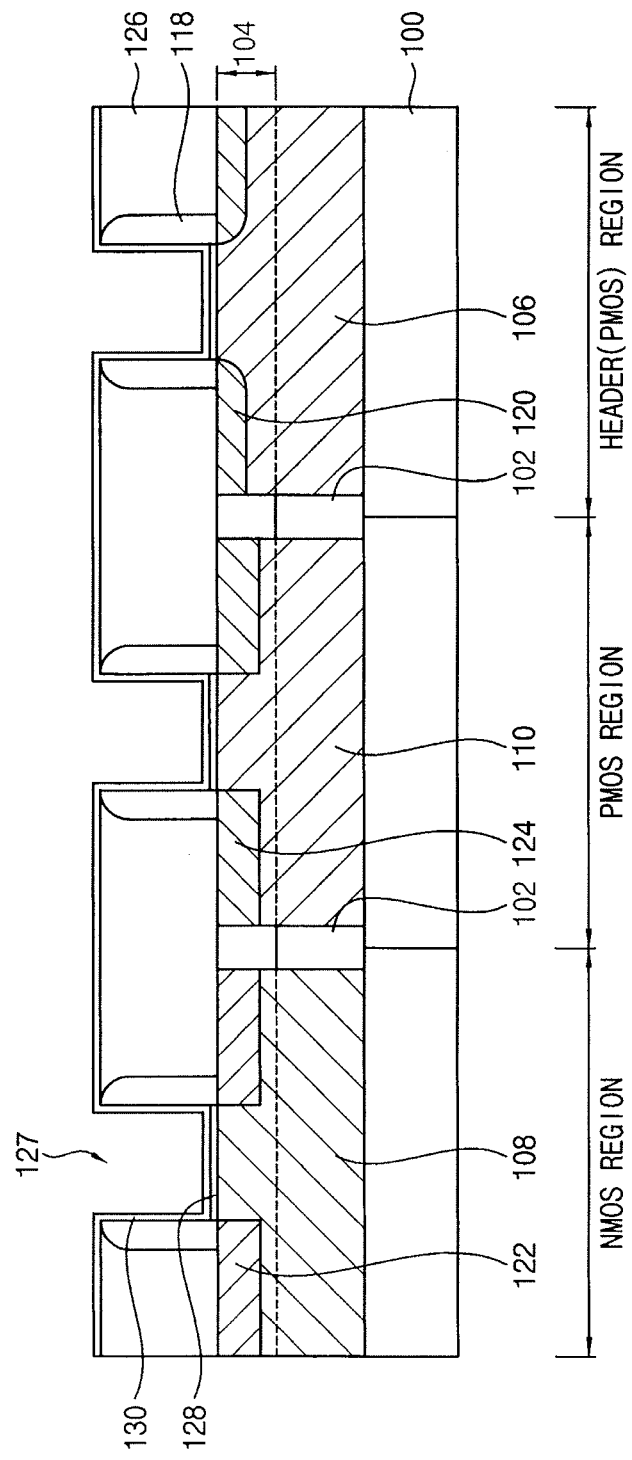
Figure 14:
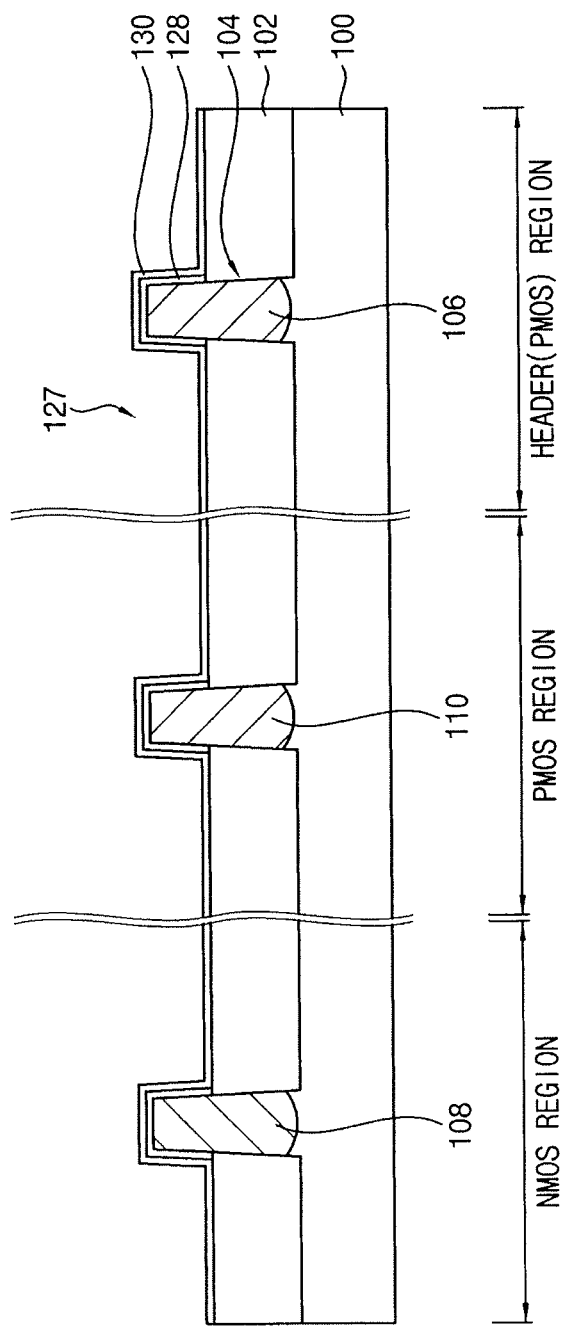

Referring to FIGS. 13 and 14, an insulating interlayer 126 covering the first to third dummy gate structures 116a, 116b, and 116c may be formed on the substrate 100, and an upper portion of the insulating interlayer 126 may be planarized until a top surface of the first to third dummy gate structures 116a, 116b, and 116c is exposed. In example embodiments, the planarization process may be performed by a chemical mechanical polishing (CMP) process and/or an etch back process.

The first to third dummy gate structures 116a, 116b, and 116c may be removed to form openings 127, respectively. Each of the openings 127 may expose a top surface of the active fin 104.

The oxide layer pattern 128 may be formed on the exposed top surface of the active fin 104 in the openings 127. The oxide layer pattern 128 may be formed by a thermal oxidation process to include silicon oxide. In example embodiments, the exposed top surface of the active fin 104 may be oxidized using, e.g., ozone gas to form the oxide layer pattern 128.

The high-k dielectric layer 130 may be conformally formed on the oxide layer pattern 128, the insulating interlayer 126, and sidewalls of the openings 127. The high-k dielectric layer 130 may be formed to include a metal oxide having a high dielectric higher than that of silicon nitride. The high-k dielectric layer 130 may include, e.g., hafnium oxide, tantalum oxide, zirconium oxide, etc.

Figure 15:
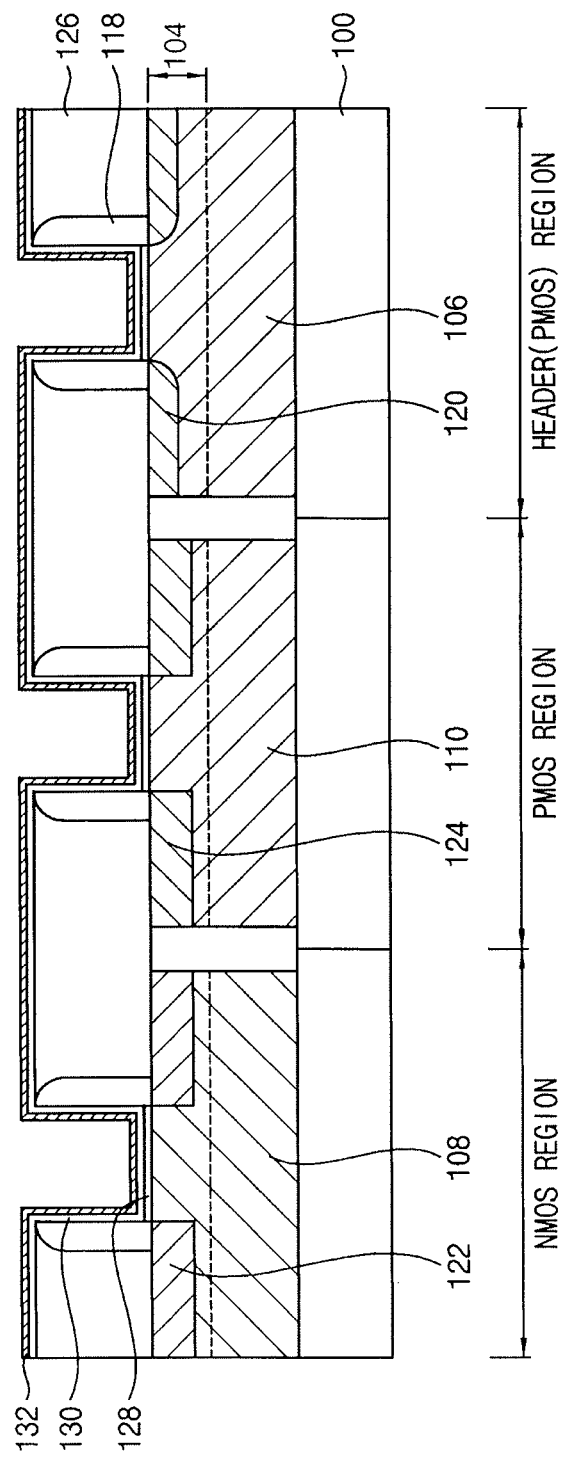
Figure 16:
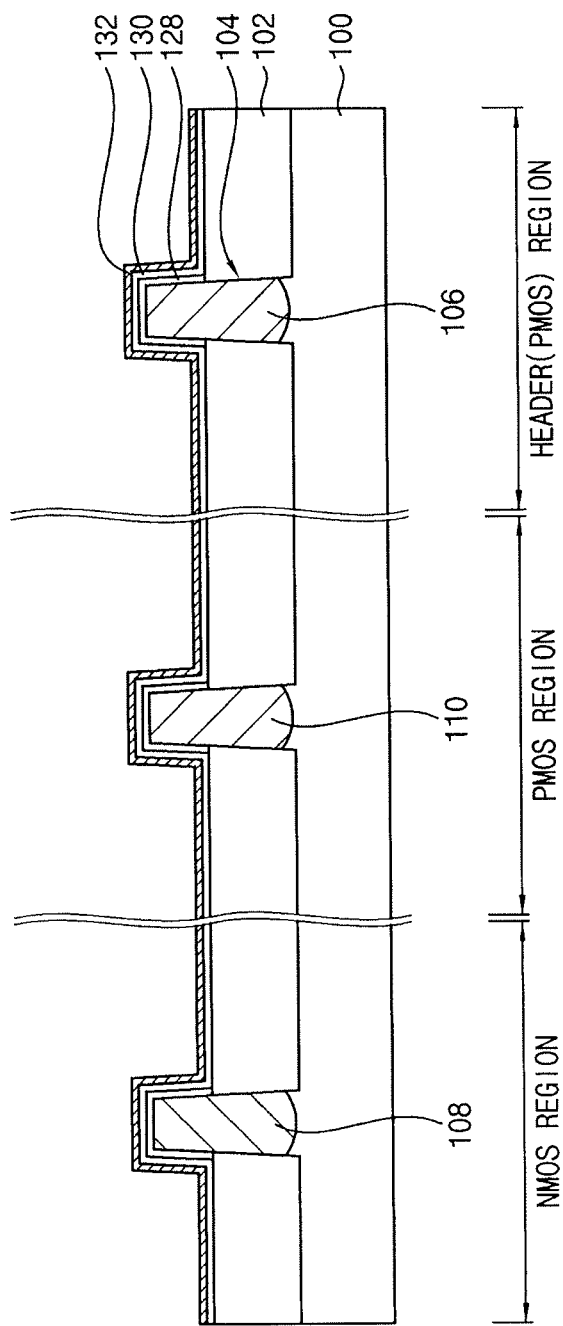

Referring to FIGS. 15 and 16, a first p-type metal layer 132 may be conformally formed on the high-k dielectric layer 130. The first p-type metal layer 132 may be formed to include a metal having a Fermi level near a valance band of silicon. That is, the first p-type metal layer 132 may include a metal having a work function more than about 4.5 eV. The first p-type metal layer 132 may include, e.g., TiN, WN, TaN, Ru, etc.

Figure 17:
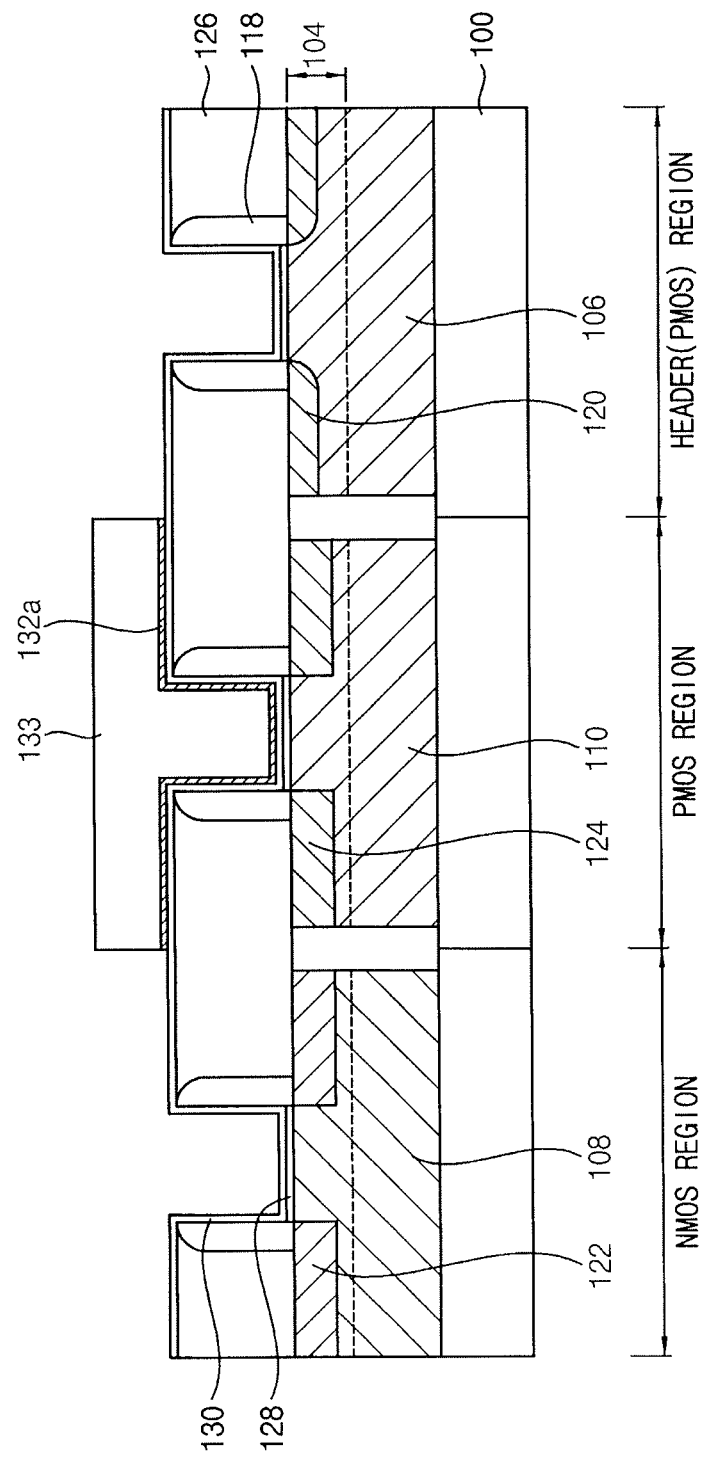
Figure 18:
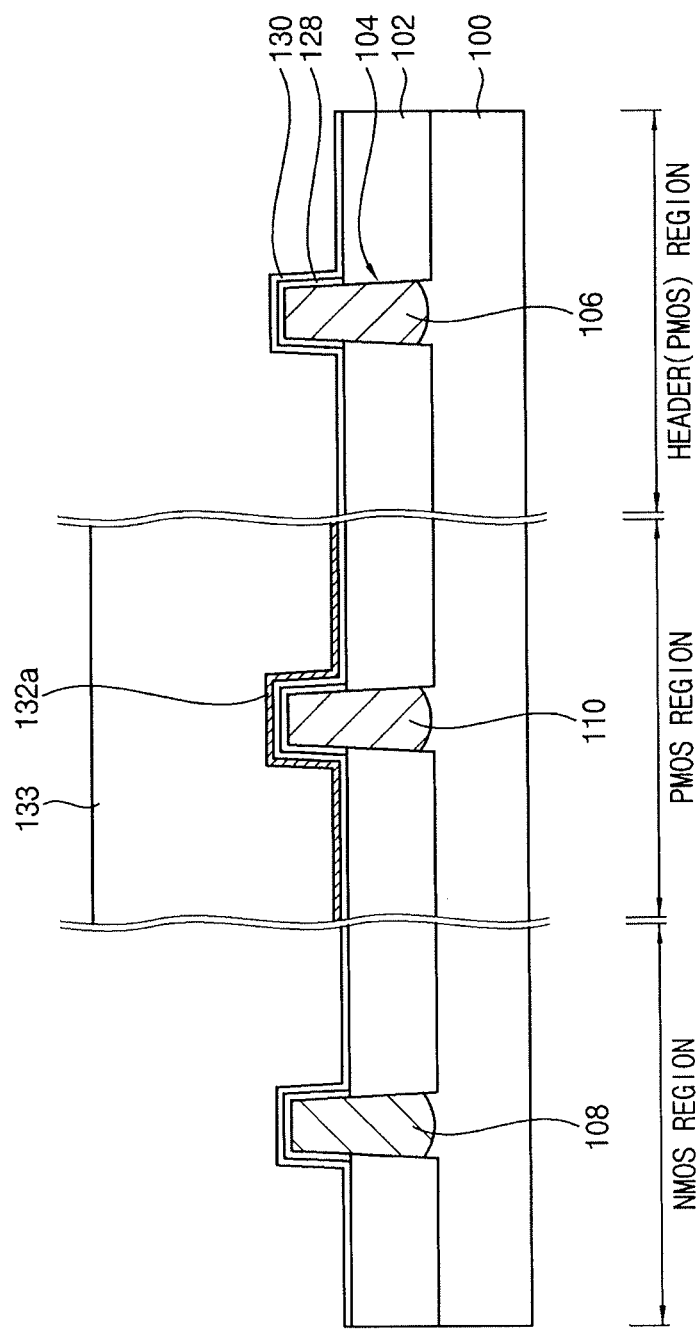

Referring to FIGS. 17 and 18, the first p-type metal layer 132 may be partially etched to form a preliminary first p-type metal pattern 132a on the high-k dielectric layer 130 of the PMOS region.

Particularly, a photoresist pattern 133 may be formed on the first p-type metal layer 132 by a photo process. The photoresist pattern 133 may selectively cover a portion of the first p-type metal layer 132 of the PMOS region. Portions of the first p-type metal layer 132 of the header region and the NMOS region may be removed using the photoresist pattern 133 as an etching mask. Thus, the high-k dielectric layer 130 of the header region and the NMOS region may be exposed. The photoresist pattern 133 may be removed by an ashing process and/or a strip process.

Figure 19:
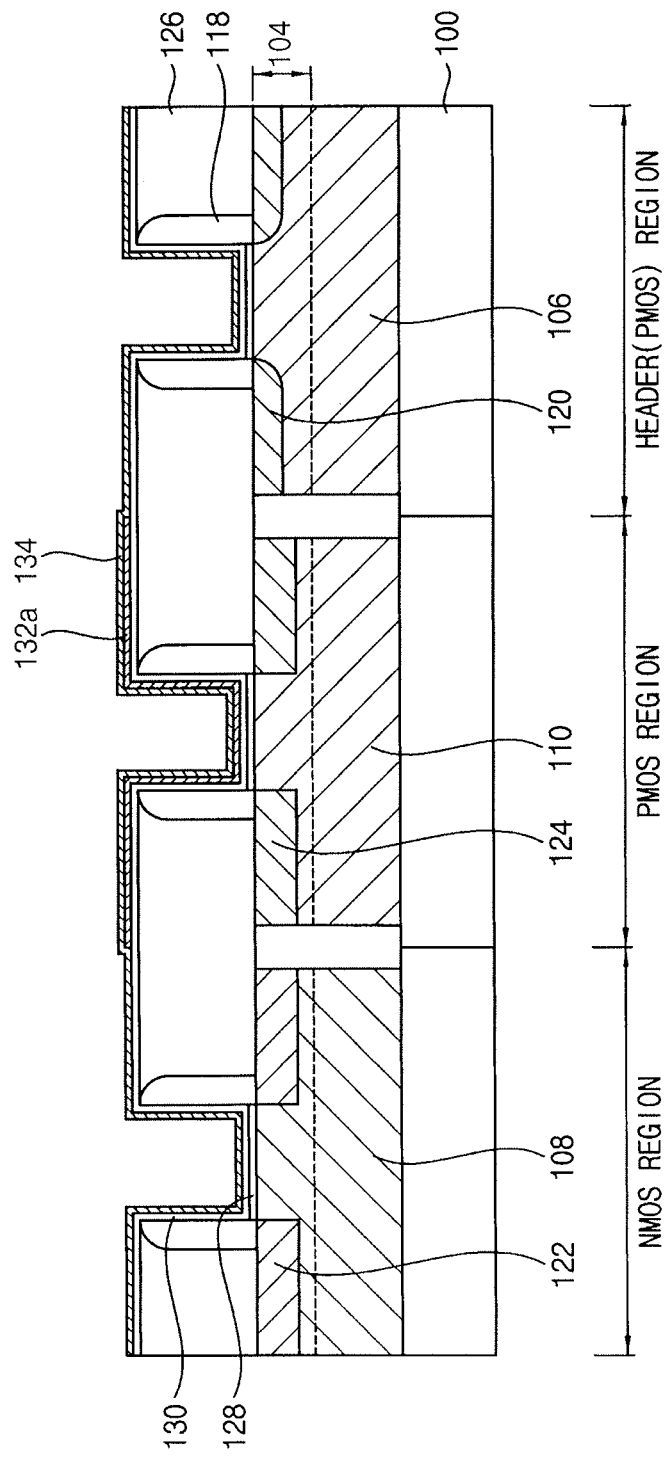
Figure 20:
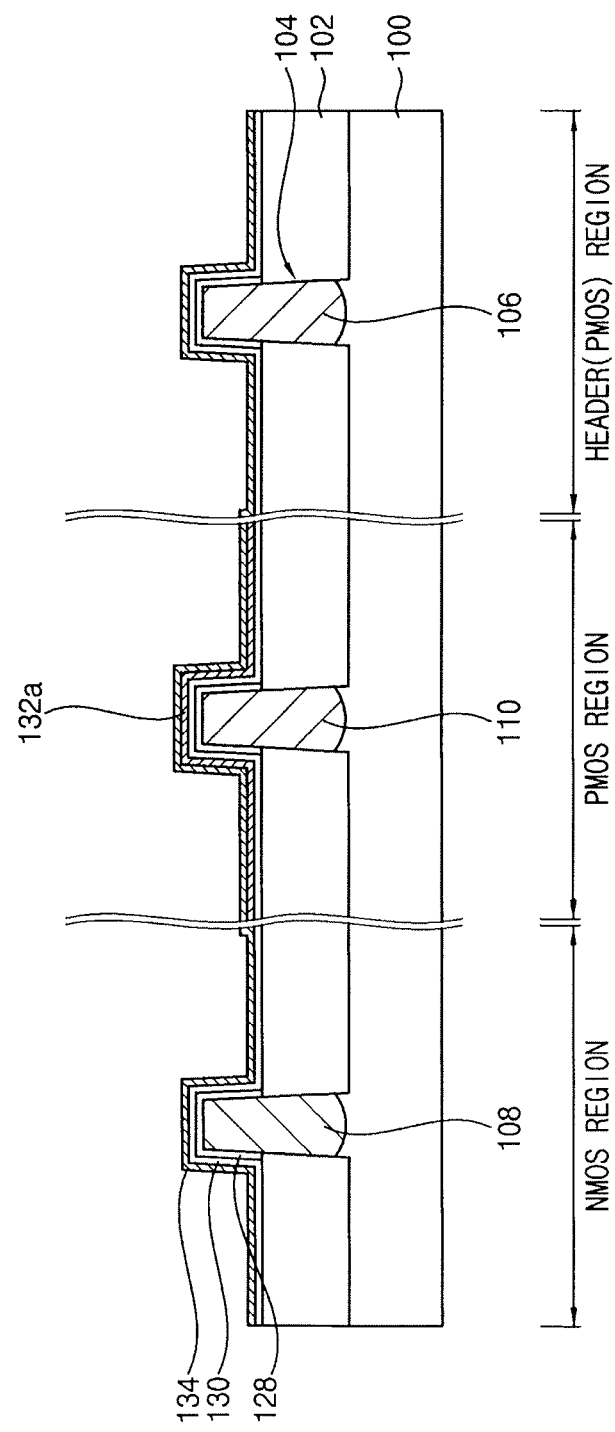

Referring to FIGS. 19 and 20, a first n-type metal layer 134 may be conformally formed on the exposed high-k dielectric layer 130 and on the preliminary first p-type metal layer pattern 132a. Thus, the first n-type metal layer 134 may directly contact the high-k dielectric layer 130 in the header region and the NMOS region, and the preliminary first p-type metal pattern 132a may directly contact the high-k dielectric layer 130 in the PMOS region.

The first n-type metal layer 134 may be formed to include a metal having a Fermi level near a conduction band of silicon. That is, the first n-type metal layer 134 may include a metal having a work function less than about 4.5 eV. The first n-type metal layer may include, e.g., Ti, Ag, Al, TiAl, TiAlN, TaC, TaCN, TaSiaN, Mn, Zr, etc.

Figure 21:
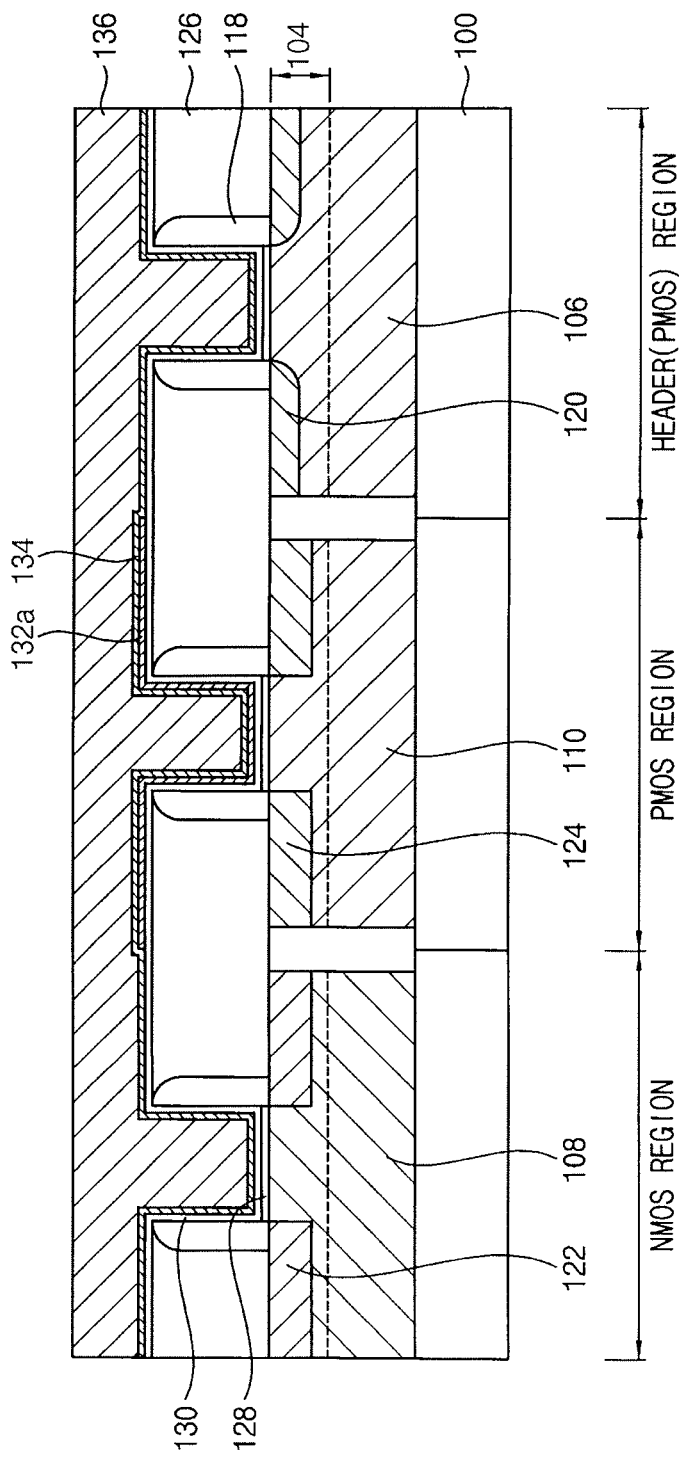
Figure 22:
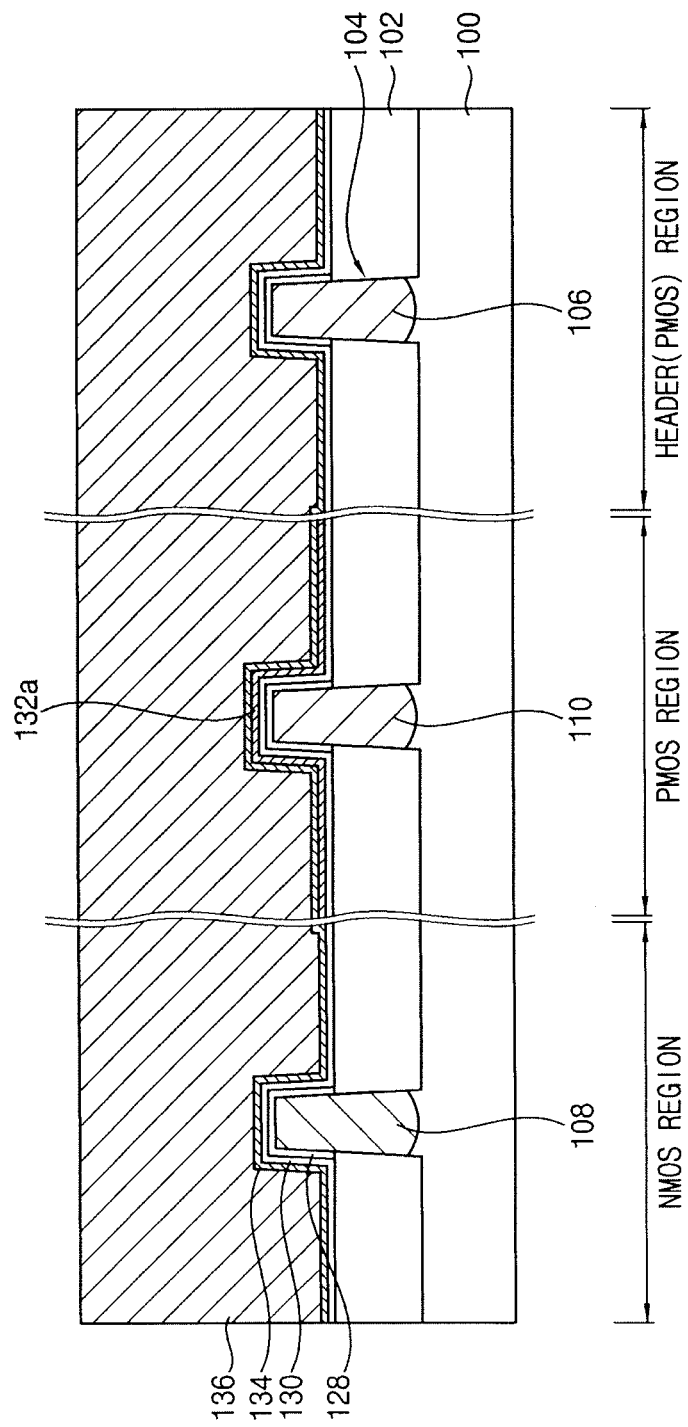

Referring to FIGS. 21 and 22, the gate electrode layer 136 may be formed on the first n-type metal layer 134 to fill the openings 127. The gate electrode layer 136 may be formed to include a material having a low resistance, e.g., a metal such as aluminum, copper, tantalum, etc.

Referring to FIGS. 1 to 3 again, the gate electrode layer 136, the first n-type metal layer 134, the preliminary first p-type metal pattern 132a, and the high-k dielectric layer 130 may be planarized until a top surface of the insulating interlayer 126 is exposed. Thus, first to third gate structures 140, 142, and 144 may be formed on the header region, the NMOS region, and the PMOS region, respectively.

The first to third gate structures 140, 142, and 144 may be formed in spaces generated by removing the first to third dummy gate structures 116a, 116b, and 116c, respectively. Thus, a critical dimension of each of the first to third gate structures 140, 142, and 144 may be less than about 50 nm. Each of first to third transistors including the first to third gate structures 140, 142, and 144 may have a channel length less than about 50 nm.

The first gate structure 140 may include the oxide layer pattern 128, the high-k dielectric layer pattern 130a, the first n-type metal layer pattern 134a, and the gate pattern 136a. The second gate structure 142 may include the oxide pattern 128, the high-k dielectric layer pattern 130a, the first n-type metal layer pattern 134a, and the gate pattern 136a. The third gate structure 144 may include the oxide pattern 128, the high-k dielectric layer pattern 130a, a first p-type metal layer pattern 132b, the first n-type metal layer pattern 134a, and the gate pattern 136a.

As described above, the first and third transistors having the p-type conductivity may be formed on the header region and the PMOS region, respectively. The second transistor having the n-type conductivity may be formed on the NMOS region.

In example embodiments, the first transistor may have a threshold voltage higher than those of transistors of the logic circuits so as to serve as the header transistor. The first transistor may be formed without performing a process for controlling the threshold voltage, e.g., a halo implantation and an additional photo process. Thus, the header transistor having a target threshold voltage may be formed without performing additional processes.

Figure 23:
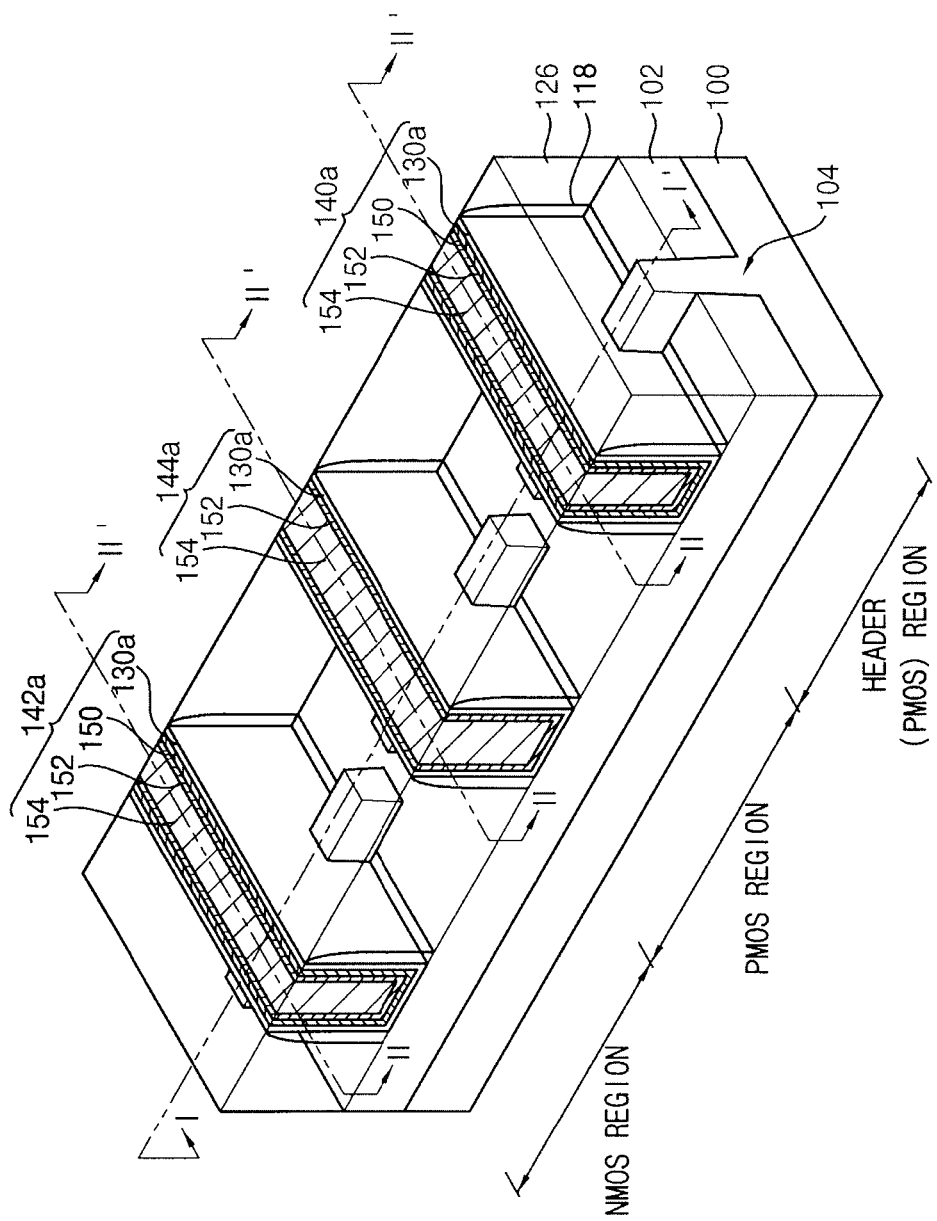
FIGS. 23 to 25 illustrate a perspective view and cross-sectional views of a semiconductor device in accordance with example embodiments.
Figure 24:
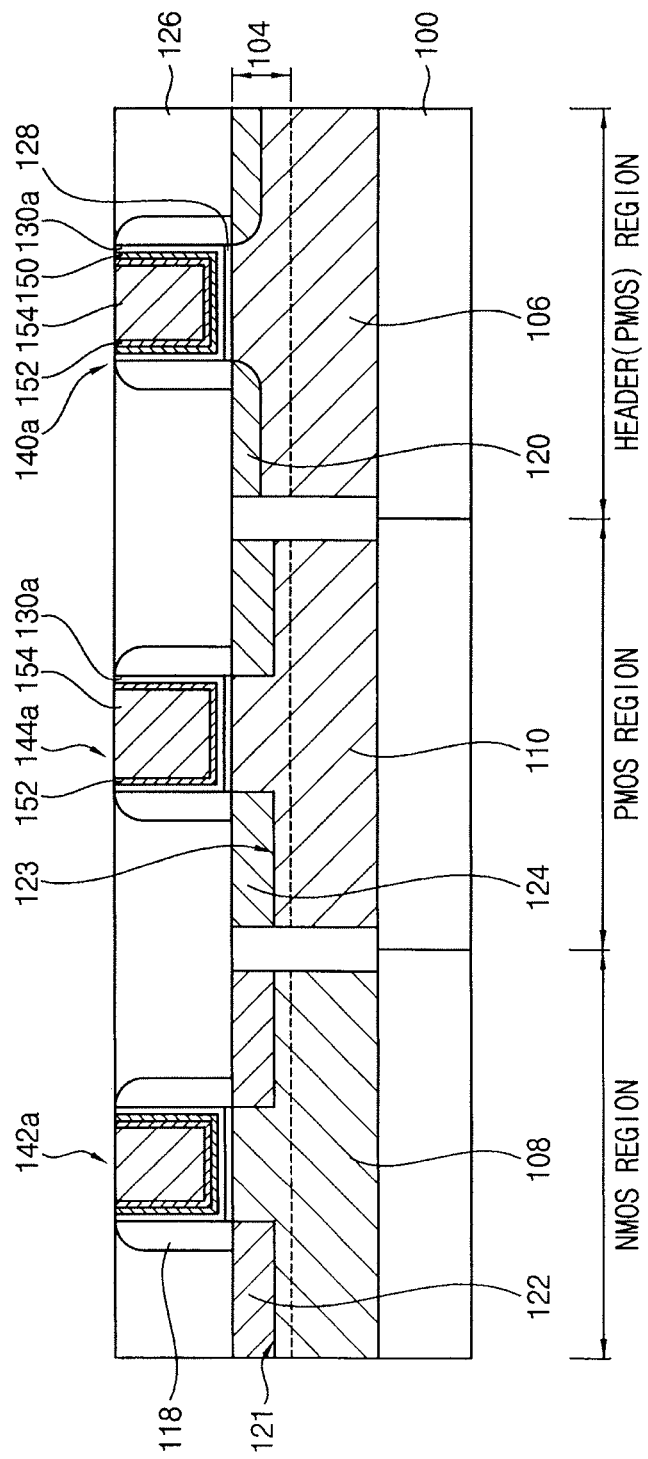
Figure 25:
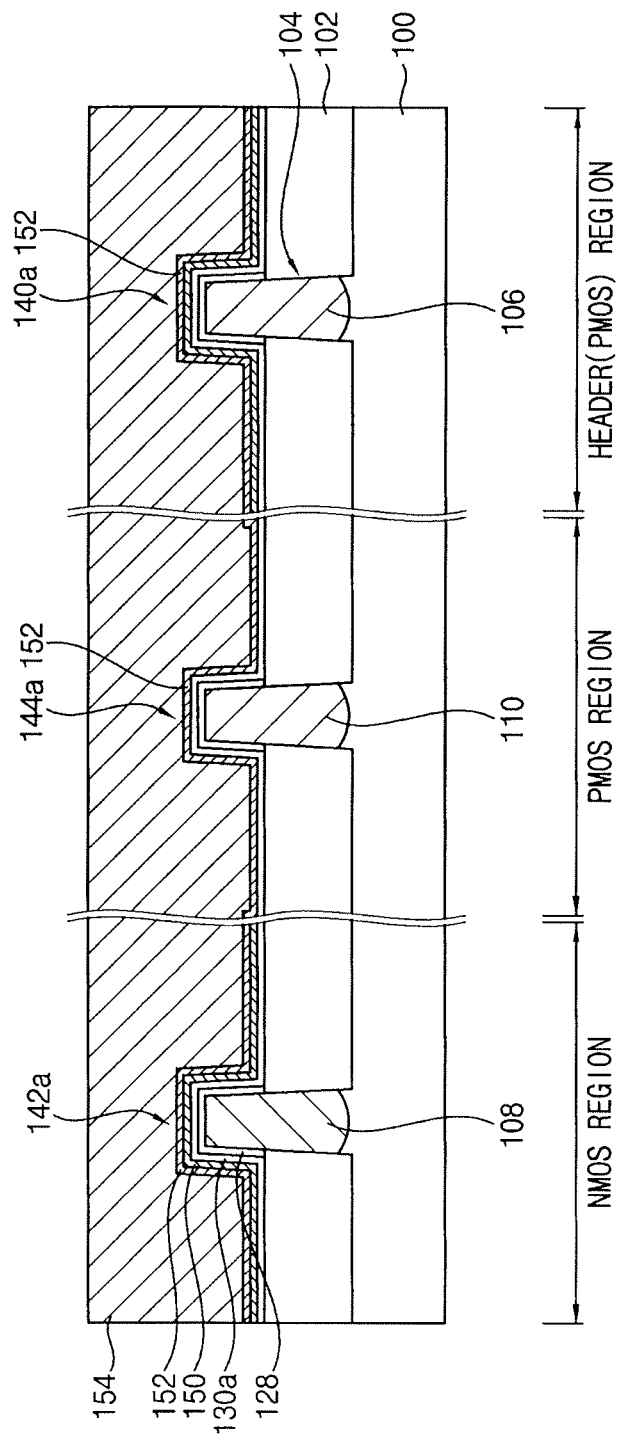

FIGS. 23 to 25 are a perspective view and cross-sectional views illustrating a semiconductor device in accordance with example embodiments. FIGS. 24 and 23 show cross-sectional views taken along lines I-I' and II-II', respectively, of FIG. 23.

The semiconductor device may be substantially the same as or similar to that illustrated in FIGS. 1 to 3, except for the first to third gate structures in the first to third transistors. Thus, like reference numerals refer to like elements, and detailed descriptions thereof are omitted herein.

Referring to FIGS. 23 to 25, the semiconductor device may include a first transistor, a second transistor, and a third transistor on the substrate 100. The substrate 100 may include the header region, the NMOS region, and the PMOS region. The first transistor may be formed on the header region and may serve as the header transistor. The second and third transistors may be formed on the NMOS and PMOS regions, respectively, and may serve as logic circuits. Each of the first and third transistors may be a PMOS transistor, and the second transistor may be a NMOS transistor.

The isolation layer 102 may be formed on the substrate 100, and the substrate 100 may include the active fin 104 protruding from the isolation layer 102.

The first transistor may include a first gate structure 140a, the first channel region 106, and the first source/drain regions 120.

The first gate structure 140a may be formed on the active fin 104 of the header region of the substrate 100. The first gate structure 140a may include the oxide layer pattern 128, the high-k dielectric layer pattern 130a, a first n-type metal pattern 150, a first p-type metal pattern 152, and a gate pattern 154 sequentially stacked. The first channel region 106 may be doped with n-type impurities. The first source/drain regions 120 may be doped with p-type impurities.

The first n-type metal pattern 150 directly contacting the high-k dielectric layer pattern 130a of the first transistor may have a same n-type conductivity as that of the first channel region 106. The first p-type metal pattern 152 may be formed on the first n-type metal pattern 150. The first p-type metal pattern 152 may not directly contact the high-k dielectric layer pattern 130a, so as not to affect a threshold voltage of the first transistor.

The second transistor may include a second gate structure 142a, the second channel region 108, and the second source/drain regions 122.

The second gate structure 142a may be formed on the active fin 104 of the NMOS region of the substrate 100. The second gate structure 142a may include the oxide layer pattern 128, the high-k dielectric layer pattern 130a, the first n-type metal pattern 150, the first p-type metal pattern 152, and the gate pattern 154 sequentially stacked. That is, the second gate structure 142a may have a stacked structure substantially the same as that of the first gate structure 140a. The second channel region 108 may be doped with p-type impurities. The second source/drain regions 122 may be doped with n-type impurities. The first n-type metal pattern 150 directly contacting the high-k dielectric layer pattern 130a of the second transistor may have n-type conductivity different from that of the second channel region 108.

In example embodiments, a first semiconductor pattern may be formed in the first recess 121 on the upper portion of the active fin 104 adjacent to the second gate structure 142a. The second source/drain regions 122 may be formed in the first semiconductor pattern.

The third transistor may include a third gate structure 144a, the third channel region 110, and the third source/drain regions 124.

The third structure 144a may be formed on the active fin 104 of the PMOS region of the substrate 100. The third gate structure 144a may include the oxide layer pattern 128, the high-k dielectric layer pattern 130a, the first p-type metal pattern 152, and the gate pattern 154 sequentially stacked. That is, the third gate structure 144a may have a stacked structure different from that of the first gate structure 140a, e.g., without the first n-type metal pattern 150. The third channel region 110 may be doped with n-type impurities. The third source/drain regions 124 may be doped with p-type impurities.

In example embodiments, a threshold voltage of the first transistor may be higher than that of transistors including the logic circuits so that the first transistor may serve as the header transistor.

The semiconductor device illustrated with reference to FIGS. 23 to 25 may be manufactured by performing processes substantially the same as or similar to those illustrated with reference to FIGS. 5 to 22. However, stack structures of the first to third gate structures may be different from those of the first to third gate structures illustrated with reference to FIGS. 5 to 22, respectively.

First, processes substantially the same as or similar to those illustrated with reference to FIGS. 5 to 14 may be performed. A first n-type metal layer may be conformally formed on the high-k dielectric layer 130, and may be partially etched by a photolithography process to form a preliminary first n-type metal pattern on the high-k dielectric layer 130 of the NMOS region and the header region of the substrate 100. A first p-type metal layer may be conformally formed on the high-k dielectric layer 130 and the preliminary first n-type metal layer, and a gate electrode layer may be formed to fill the opening 127.

The gate electrode layer, the first p-type metal layer, the preliminary metal layer pattern, and the high-k dielectric layer 130 may be planarized until a top surface of the insulating interlayer 126 is exposed to form first to third gate structures 140a, 142a, and 144a on the header region, the NMOS region, and the PMOS region, respectively, of the substrate 100.

In example embodiments, the first transistor may be formed without performing a process for controlling the threshold voltage, e.g., without a halo implantation and an additional photo process. Thus, the header transistor having a target threshold voltage may be formed without performing additional processes.

Figure 26:
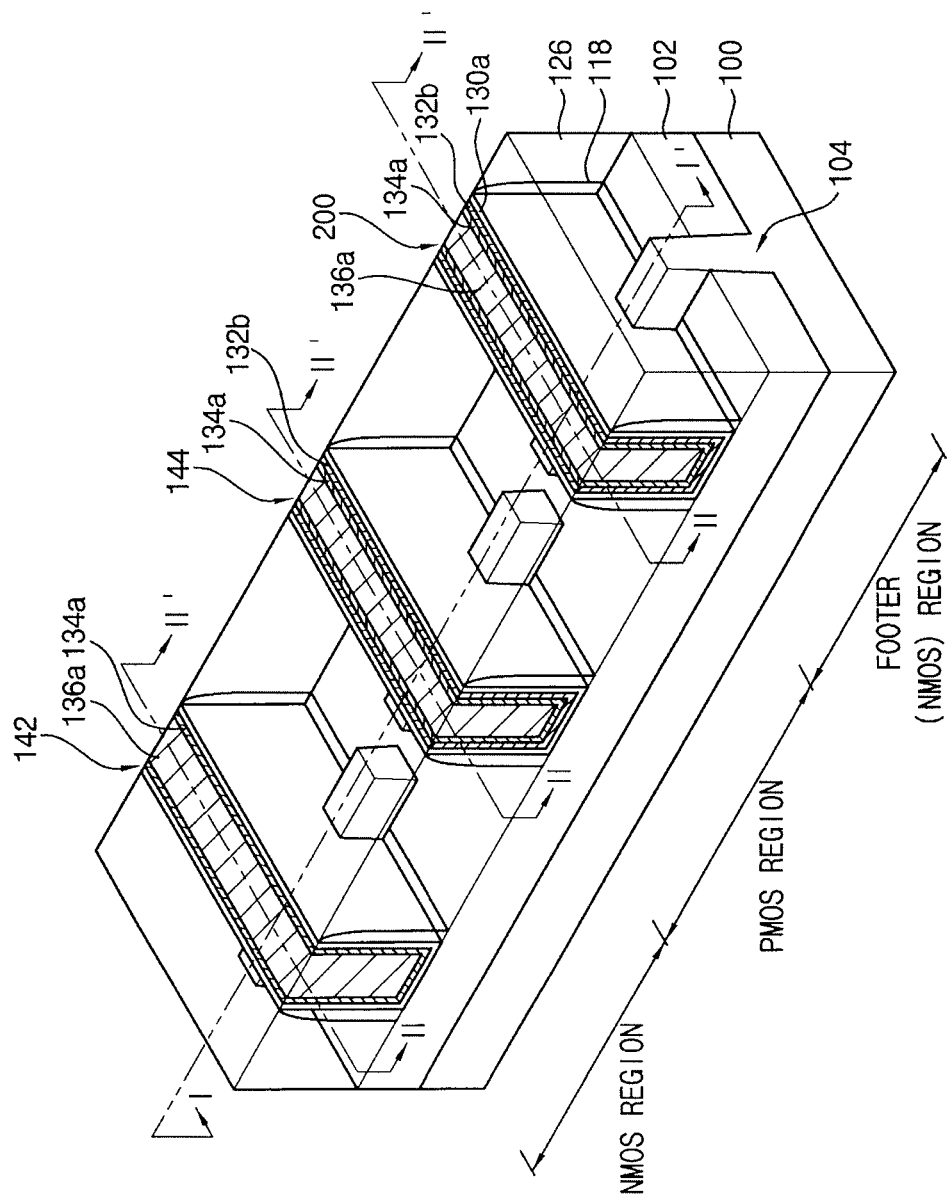
FIGS. 26 to 28 illustrate a perspective view and cross-sectional views of a semiconductor device in accordance with example embodiments.
Figure 27:
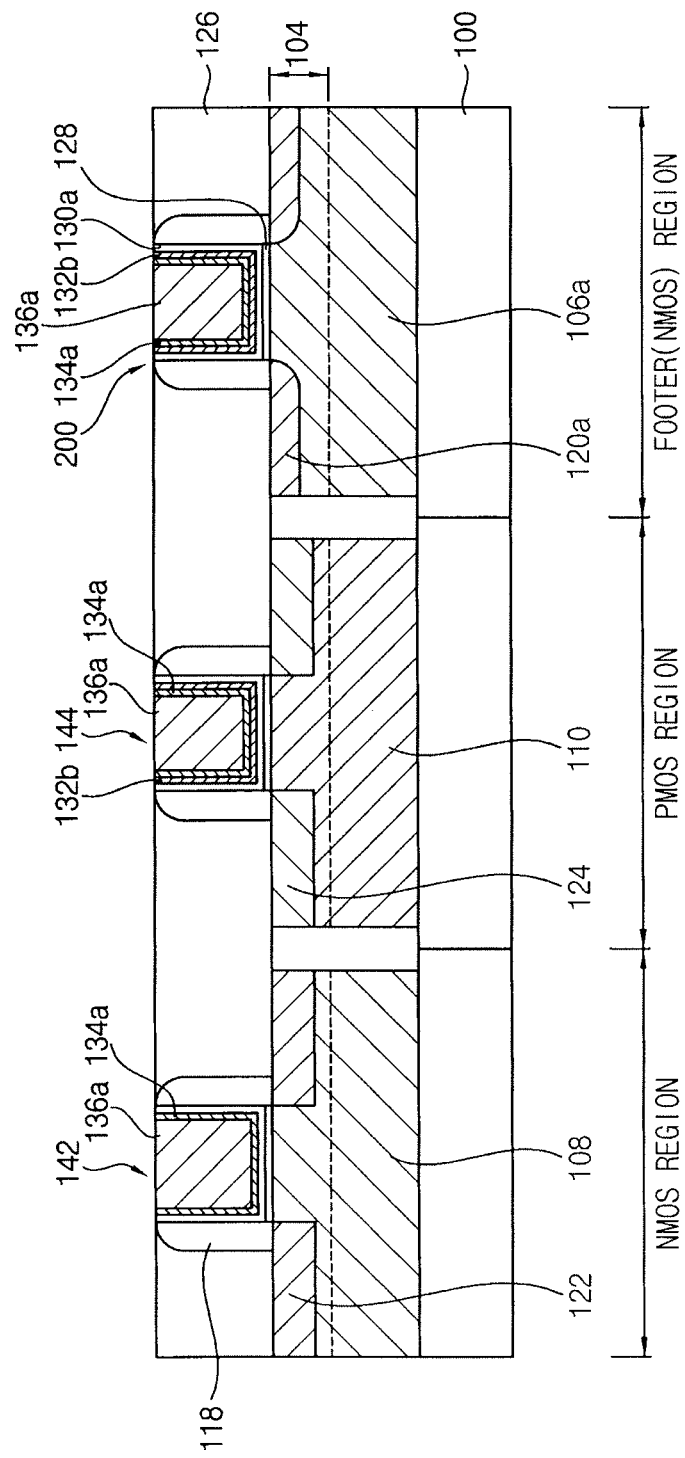
Figure 28:
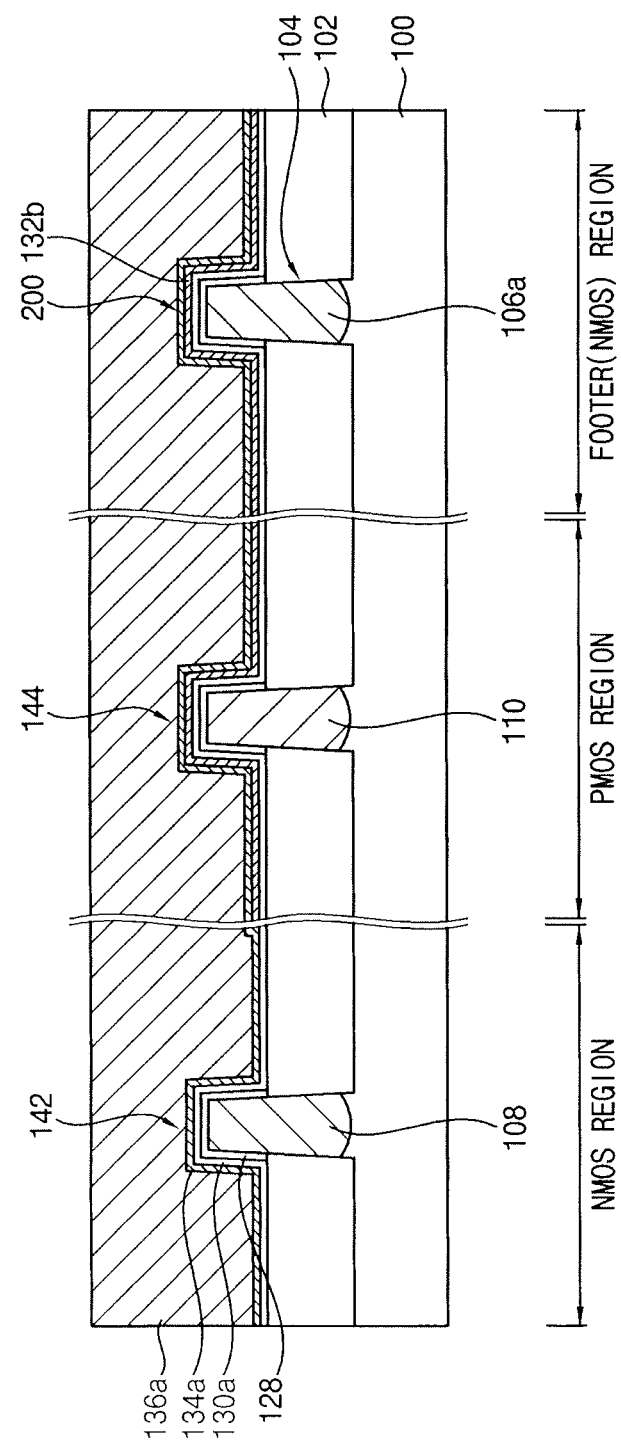

FIGS. 26 to 28 are a perspective view and cross-sectional views illustrating a semiconductor device in accordance with example embodiments. FIGS. 27 and 28 show cross-sectional views taken along lines I-I' and II-II', respectively, of FIG. 26.

The semiconductor device may have a first transistor serving as a footer transistor. The semiconductor device may be substantially the same as or similar to that illustrated in FIGS. 1 to 3, except for the first transistor.

Referring to FIGS. 26 to 28, the semiconductor device may include a first transistor, a second transistor, and a third transistor on the substrate 100. The substrate 100 may include a footer region, an NMOS region, and a PMOS region. The first transistor may be formed on the footer region of the substrate 100, and may serve as a footer transistor. The second and third transistors may be formed on the NMOS and PMOS regions, respectively, of the substrate 100, and may serve as logic circuits. Each of the first and second transistors may be an NMOS transistor, and the third transistor may be a PMOS transistor.

The isolation layer 102 may be formed on the substrate 100, and the substrate 100 may include the active fin 104 protruding from the isolation layer 102.

The first transistor may include a first gate structure 200, a first channel region 106a, and first source/drain regions 120a.

The first gate structure 200 may be formed on the active fin 104 of the footer region of the substrate 100. The first gate structure 200 may include the oxide layer pattern 128, the high-k dielectric layer pattern 130a, the first p-type metal pattern 132b, the first n-type metal pattern 134a, and the gate pattern 136a sequentially stacked. The first channel region 106a may be doped with p-type impurities. The first source/drain regions 120a may be doped with n-type impurities.

The first metal pattern 132b directly contacting the high-k dielectric layer pattern 130a of the first transistor may have a p-type conductivity the same as that of the first channel region 106a. The first n-type metal pattern 134a may be formed on the first p-type metal pattern 132b. The first n-type metal pattern 134a may not directly contact the high-k dielectric layer pattern 130a, so as not to affect a threshold voltage of the first transistor.

The second transistor may include the second gate structure 142, the second channel region 108, and the second source/drain regions 122.

The second gate structure 142 may be formed on the active fin 104 of the NMOS region of the substrate 100. The second gate structure 142 may include the oxide layer pattern 128, the high-k dielectric layer pattern 130a, the first n-type metal pattern 134a, and the gate pattern 136a sequentially stacked. The first and second transistors may have the same conductivity type, however, the second gate structure 142 may have a stacked structure different from that of the first gate structure 200, e.g., without the first p-type metal pattern 132b. The second channel region 108 may be doped with p-type impurities. The second source/drain regions 122 may be doped with n-type impurities.

The first metal pattern 134a directly contacting the high-k dielectric layer pattern 130a of the second transistor may have a n-type conductivity different from that of the second channel region 108.

In example embodiments, the second source/drain regions 122 may be formed in a first semiconductor pattern.

The third transistor may include a third gate structure 144, a third channel region 110 and third source/drain regions 124.

The third gate structure 144 may be formed on the active fin 104 of the PMOS region of the substrate 100.

The third gate structure 144 may include the oxide layer pattern 128, the high-k dielectric layer pattern 130a, the first p-type metal pattern 132b, the first n-type metal pattern 134a and a gate pattern 136a sequentially stacked. That is, the third gate structure 144 may have a stacked structure substantially the same as that of the first gate structure 200. The third channel region 110 may be doped with n-type impurities. The third source/drain regions 124 may be doped with p-type impurities.

In example embodiments, the third source/drain regions 124 may be formed in a second semiconductor pattern.

In example embodiments, a threshold voltage of the first transistor may be higher than that of transistors including the logic circuits so that the first transistor may serve as the footer transistor.

The semiconductor device illustrated with reference to FIGS. 26 to 28 may be manufactured by performing processes substantially the same as or similar to those illustrated with reference to FIGS. 5 to 22. However, etching target layers for forming first to third gate structures may be different from those for forming the first to third gate structures illustrated with reference to FIGS. 5 to 22, respectively.

Particularly, a substrate 100 including a footer region, an NMOS region and a PMOS region may be provided. A footer transistor may be formed on the footer region of the substrate 100, and NMOS and PMOS transistors serving as logic circuits may be formed on the NMOS and PMOS regions, respectively, of the substrate 100.

Processes substantially the same as or similar to those illustrated with reference to FIGS. 5 to 16 may be performed on the substrate 100. The first p-type metal layer 132 may be partially etched by a photolithography process to form a preliminary first p-type metal pattern on the high-k dielectric layer of the PMOS region and the footer region of the substrate 100. Then, processes substantially the same as or similar to those illustrated with reference to FIGS. 19 to 22 may be performed to form first to third gate structures 200, 142 and 144 on the footer region and NMOS and PMOS regions, respectively.

In example embodiments, the first transistor may be formed without performing a process for controlling the threshold voltage, e.g., a halo implantation and an additional photo process. Thus, the footer transistor having a target threshold voltage may be formed without performing additional processes.

Figure 29:
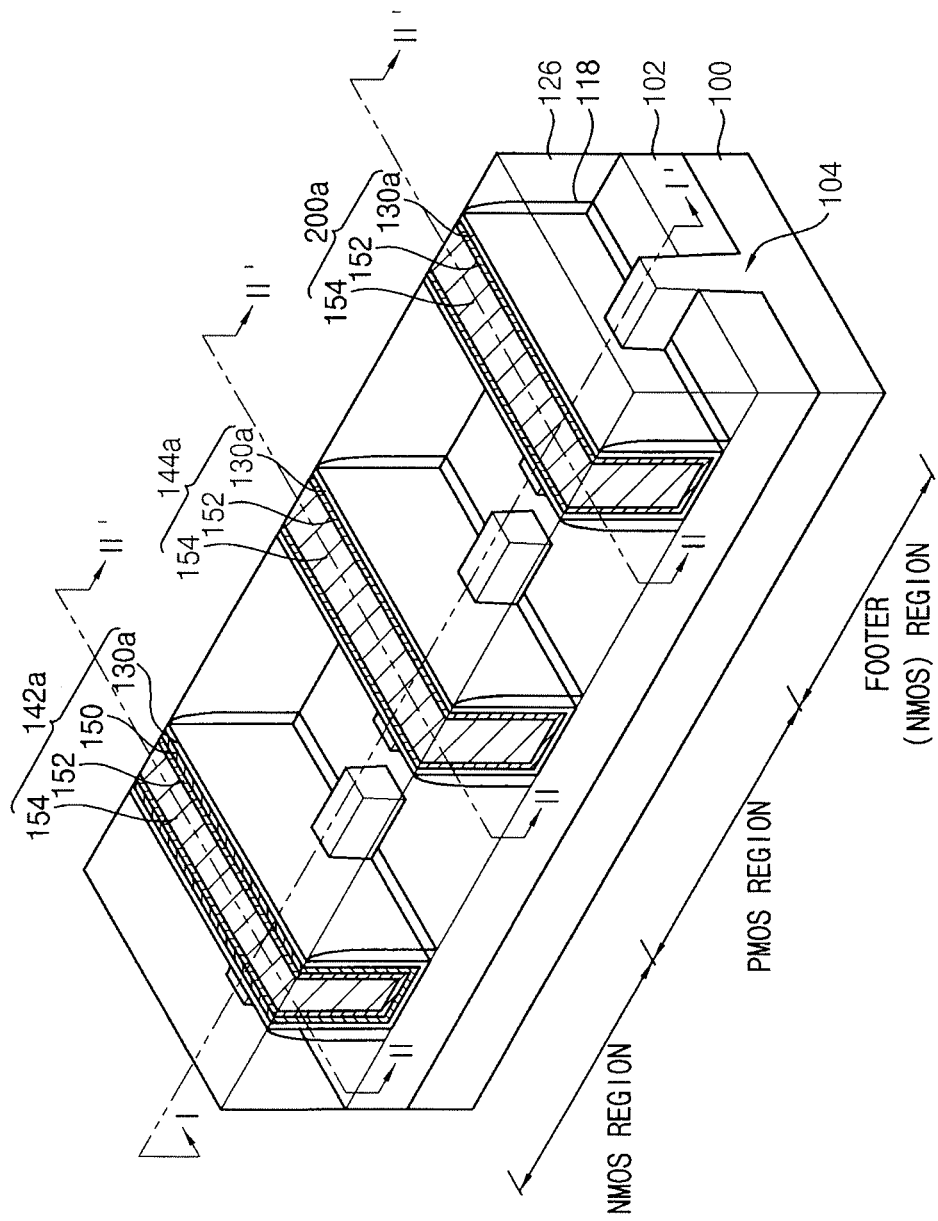
FIGS. 29 to 31 illustrate a perspective view and cross-sectional views of a semiconductor device in accordance with example embodiments.
Figure 30:
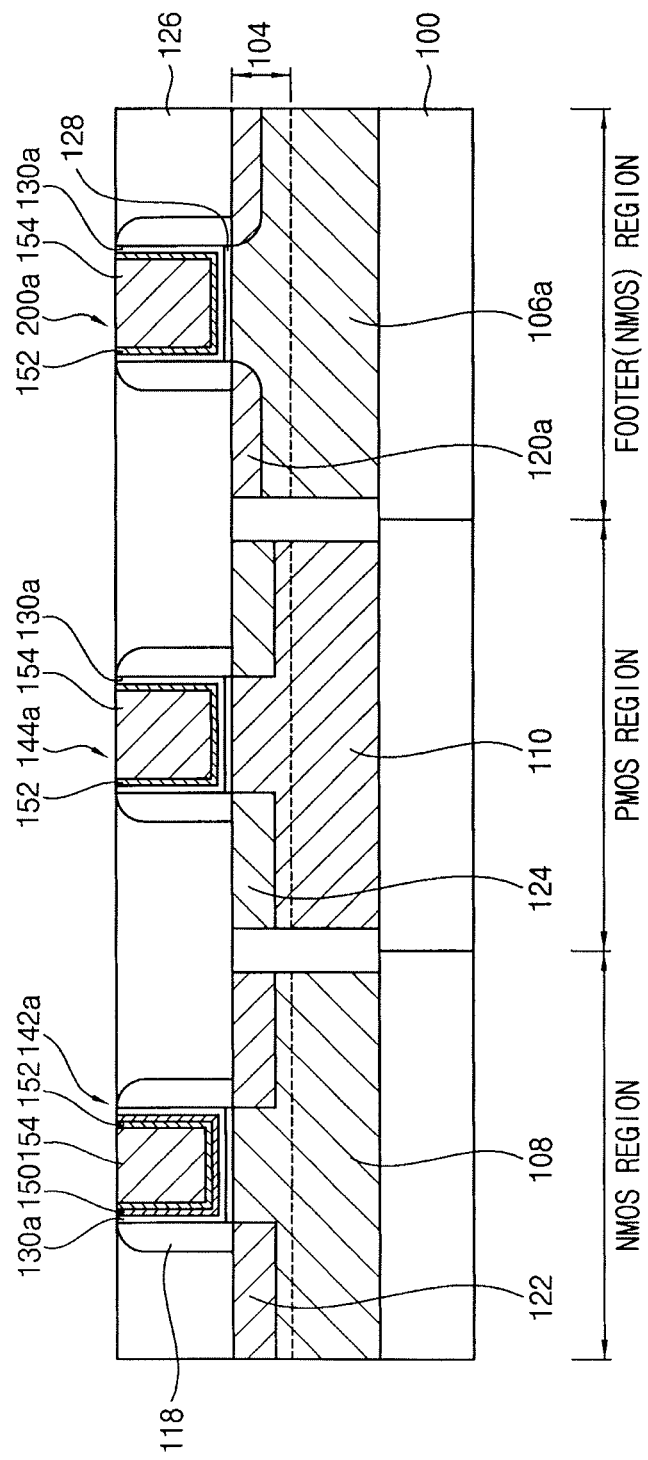
Figure 31:
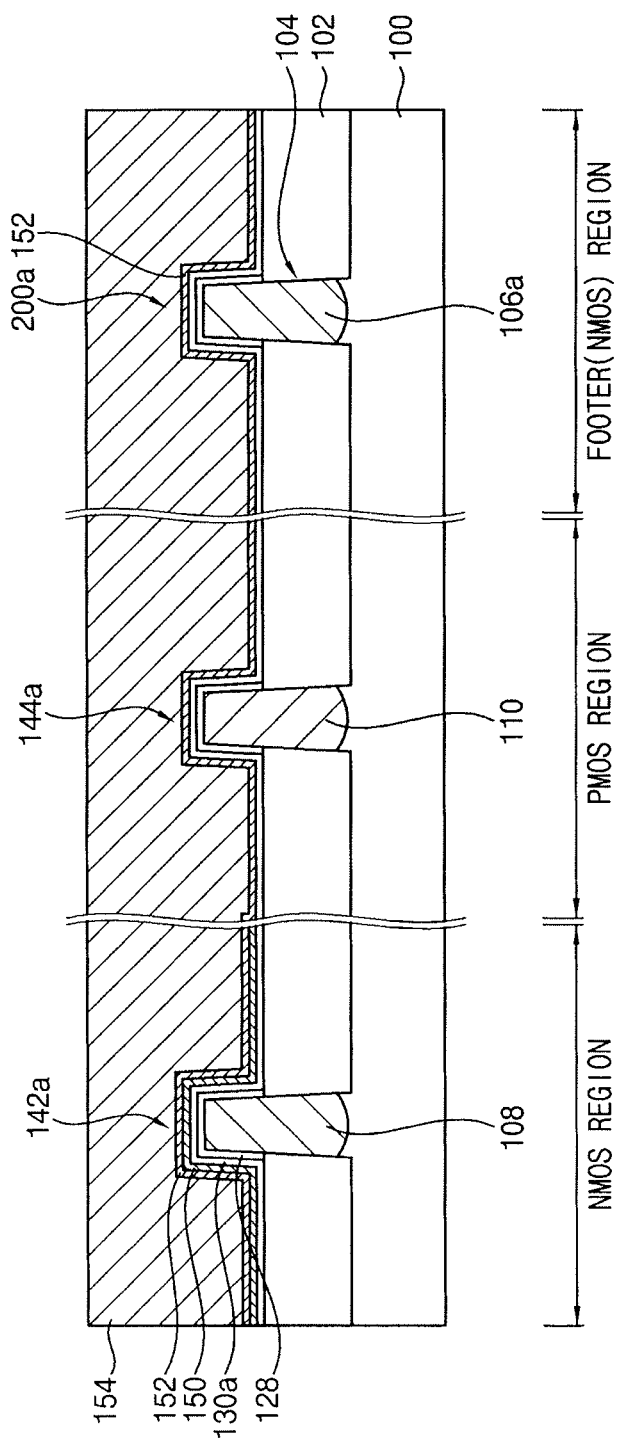

FIGS. 29 to 31 are a perspective view and cross-sectional views illustrating a semiconductor device in accordance with example embodiments. FIGS. 30 and 31 show cross-sectional views taken along lines I-I' and II-II', respectively, of FIG. 29.

The semiconductor device may have a first transistor serving as a footer transistor. The semiconductor device may be substantially the same as or similar to that illustrated in FIGS. 23 to 25, except for the first transistor.

Referring to FIGS. 29 to 31, the semiconductor device may include a first transistor, a second transistor and a third transistor on a substrate 100. The substrate 100 may include a footer region, an NMOS region and a PMOS region. The first transistor may be formed on the footer region of the substrate 100, and may serve as a footer transistor. The second and third transistors may be formed on the NMOS and PMOS regions, respectively, of the substrate 100, and may serve as logic circuits. Each of the first and second transistors may be an NMOS transistor, and the third transistor may be a PMOS transistor.

An isolation layer 102 may be formed on the substrate 100, and the substrate 100 may include an active fin 104 protruding from the isolation layer 102.

The first transistor may include a first gate structure 200a, a first channel region 106a and first source/drain regions 120a.

The first gate structure 200a may be formed on the active fin 104 of the footer region of the substrate 100. The first gate structure 200a may include an oxide layer pattern 128, a high-k dielectric layer pattern 130a, a first p-type metal pattern 152 and a gate pattern 154 sequentially stacked. The first channel region 106a may be doped with p-type impurities. The first source/drain regions 120a may be doped with n-type impurities.

The first metal pattern 152 directly contacting the high-k dielectric layer pattern 130a of the first transistor may have a p-type conductivity the same as that of the first channel region 106a.

The second transistor may include a second gate structure 142a, a second channel region 108 and second source/drain regions 122.

The second gate structure 142a may be formed on the active fin 104 of the NMOS region of the substrate 100. The second gate structure 142a may include the oxide layer pattern 128, the high-k dielectric layer pattern 130a, a first n-type metal pattern 150, the first p-type metal pattern 152 and a gate pattern 154 sequentially stacked. The first and second transistors may have the same conductivity type, however, the second gate structure 142a may have a stacked structure different from that of the first gate structure 200a. The second channel region 108 may be doped with p-type impurities. The second source/drain regions 122 may be doped with n-type impurities.

The first metal pattern 150 directly contacting the high-k dielectric layer pattern 130a of the second transistor may have a n-type conductivity different from that of the second channel region 108.

In example embodiments, the second source/drain regions 122 may be formed in a first semiconductor pattern.

The third transistor may include the third gate structure 144a, a third channel region 110, and third source/drain regions 124.

The third structure 144a may be formed on the active fin 104 of the PMOS region of the substrate 100.

The third gate structure 144a may include the oxide layer pattern 128, the high-k dielectric layer pattern 130a, the first p-type metal pattern 152, and the gate pattern 154 sequentially stacked. That is, the third gate structure 144a may have a stacked structure substantially the same as that of the first gate structure 200. The third channel region 110 may be doped with n-type impurities. The third source/drain regions 124 may be doped with p-type impurities.

In example embodiments, the third source/drain regions 124 may be formed in a second semiconductor pattern.

In example embodiments, a threshold voltage of the first transistor may be higher than that of transistors including the logic circuits so that the first transistor may serve as the footer transistor.

The semiconductor device illustrated with reference to FIGS. 29 to 31 may be manufactured by performing processes substantially the same as or similar to those illustrated with reference to FIGS. 5 to 22. However, stacked layers for forming first to third gate structures may be different from those for forming the first to third gate structures, respectively.

Particularly, the substrate 100 including a footer region, an NMOS region, and a PMOS region may be provided. A footer transistor may be formed on the footer region of the substrate 100, and NMOS and PMOS transistors serving as logic circuits may be formed on the NMOS and PMOS regions, respectively, of the substrate 100.

Processes substantially the same as or similar to those illustrated with reference to FIGS. 5 to 14 may be performed on the substrate 100. A first n-type metal layer may be conformally formed on the high-k dielectric layer 130, and may be partially etched by a photolithography process to form a preliminary first n-type metal pattern on the high-k dielectric layer 130 of the NMOS region of the substrate 100. A first p-type metal layer may be formed conformally on the preliminary first n-type metal pattern, and gate electrode layer may be formed to fill the opening 127.

The gate electrode layer, the first p-type metal layer, the preliminary first n-type metal pattern and the high-k dielectric layer 130 may be planarized until a top surface of the insulating interlayer 126 may be exposed. Thus, first to third gate structures 200a, 142a and 144a may be formed on the footer region, the NMOS region and the PMOS region, respectively, of the substrate 100.

In example embodiments, the first transistor may be formed without performing a process for controlling the threshold voltage, e.g., a halo implantation and an additional photo process. Thus, the footer transistor having a target threshold voltage may be formed without performing additional processes.

EXPERIMENT

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Example 1

A header transistor having a structure substantially the same as that of the first transistor illustrated with reference to FIGS. 1 to 3 was formed on an active fin of a semiconductor. Particularly, the header transistor included a first gate structure, a first channel region, and first source/drain regions. The first gate structure included an oxide layer pattern, a high-k dielectric layer pattern, a first n-type metal pattern, and a gate pattern sequentially stacked. The first channel region was doped with n-type impurities, and the first source/drain regions were doped with p-type impurities. The header transistor was formed without performing a process for controlling the threshold voltage, e.g., a halo implantation.

Comparative Example 1

A PMOS transistor having a structure substantially the same as that of the third transistor illustrated with reference to FIGS. 1 to 3 was formed on an active fin of a semiconductor. Particularly, the PMOS transistor included a third gate structure, a third channel region, and third source/drain regions. The third gate structure included an oxide layer pattern, a high-k dielectric layer pattern, a first p-type metal pattern, a first n-type metal pattern, and a gate pattern sequentially stacked. The third channel region was doped with n-type impurities, and the third source/drain regions were doped with p-type impurities. Also, the PMOS transistor included a halo region that was formed by a halo implantation process.

Figure 32:
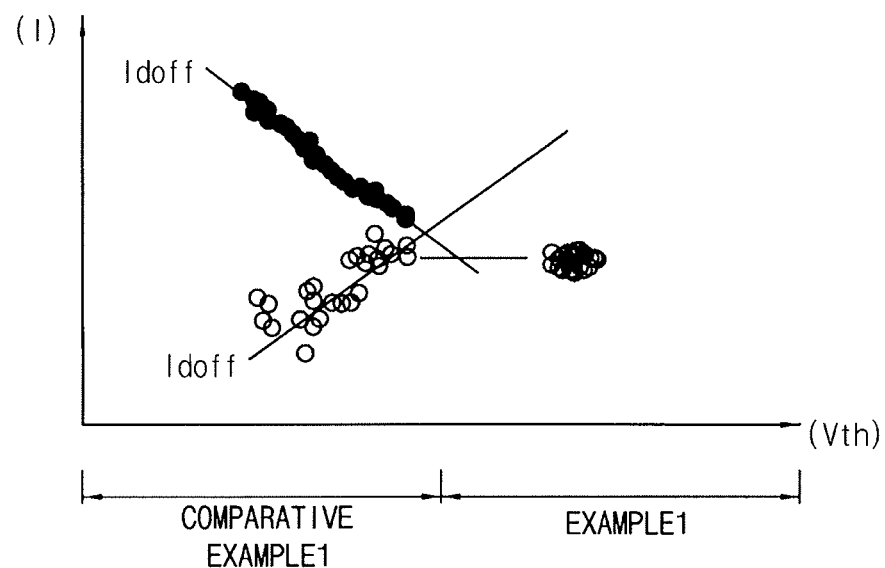
FIG. 32 illustrates a graph of leakage currents of Example 1 and Comparative Example 1.

FIG. 32 is a graph illustrating leakage currents of Example 1 and Comparative Example 1.

Referring to FIG. 32, bulk leakage currents in Example 1 are reduced because the halo implantation process was not performed. Thus, total leakage currents in Example 1 are reduced.

However, bulk leakage currents in Comparative Example 1 are generated because the halo implantation process was performed. Particularly, the bulk leakage currents are increased as drain leakage currents are reduced by the halo implantation process. Thus, total leakage currents of Comparative Example 1 are higher than those of Example 1.

Figure 33:
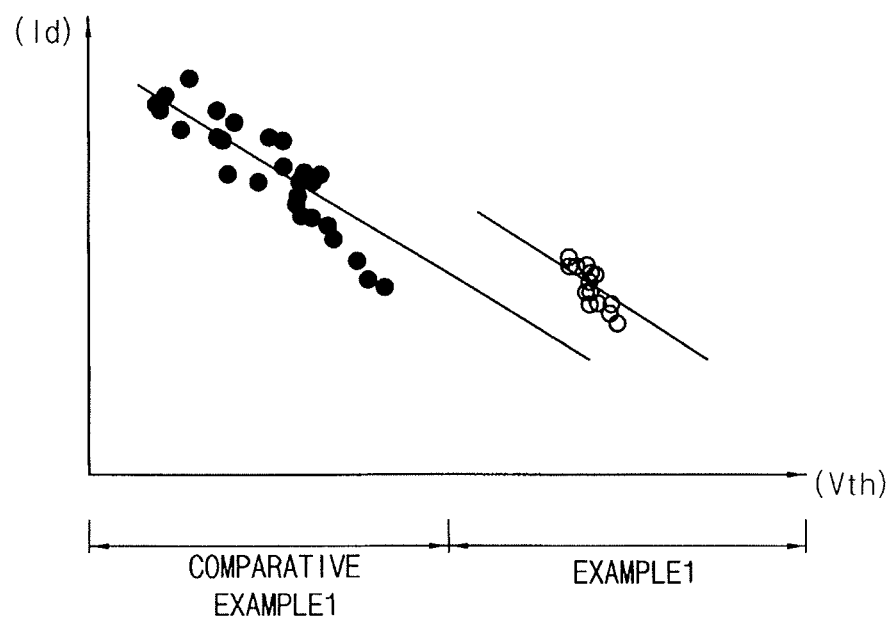
FIG. 33 illustrates a graph of drain currents of Example 1 and Comparative Example 1.

FIG. 33 is a graph illustrating drain currents of Example 1 and Comparative Example 1.

Referring to FIG. 33, drain currents of Comparative Example 1 are reduced as a threshold voltage of Comparative Example 1 is decreased. When the halo implantation process was performed to have a high threshold voltage, the drain currents of the Comparative Example were reduced so that the performance of the Comparative Example is degraded. In contrast, Example 1 has a threshold voltage and drain currents higher than those of the Comparative Example, respectively.

The above semiconductor device and method of manufacturing the same may be applied to various types of devices including MOS transistors, e.g., logic devices, memory device, memory system, etc.

By way of summation and review, example embodiments provide a semiconductor device including a transistor having a target threshold voltage, and a method of manufacturing the semiconductor device. That is, according to example embodiments, a semiconductor device may include a fin-type transistor including a metal gate having a same conductivity type as that of a channel region. Accordingly, the fin-type transistor may have a high threshold voltage, low leakage currents, and/or low stand-by currents. The fin-type transistor may serve as a header transistor or a footer transistor for switching logic circuits, so that the semiconductor device may have high performance.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a substrate including an active fin and an isolation layer thereon;
   a first gate structure on the active fin, the first gate structure including a first gate insulation layer pattern and a first metal pattern, and the first metal pattern having a first conductivity type and being disposed on the first gate insulation layer pattern;
   a first channel region at a portion of the active fin facing a bottom surface of the first gate structure, the first channel region including impurities having the first conductivity type; and
   first source/drain regions at upper portions of the active fin adjacent to opposite sidewalls of the first gate structure, the first source/drain regions including impurities having a second conductivity type different from the first conductivity type,
   wherein the first gate structure, the first channel region, and the first source/drain regions define a first transistor, the first transistor being electrically connected to an input part or to an output part of a logic circuit to switch the logic circuit.

2. The semiconductor device as claimed in claim 1, wherein the first transistor is electrically connected to the input part of the logic circuit, the first transistor being a header transistor for switching the logic circuit.

3. The semiconductor device as claimed in claim 1, wherein the first transistor is electrically connected to the output part of the logic circuit, the first transistor being a footer transistor for switching the logic circuit.

4. The semiconductor device as claimed in claim 1, wherein the logic circuit includes second transistors on a region of the substrate, wherein each of the second transistors includes:
   a second gate structure on the active fin, the second gate structure including the first gate insulation layer pattern and a second metal pattern, and the second metal pattern having a third conductivity type and directly contacting the first gate insulation layer pattern,
   a second channel region at a portion of the active fin facing a bottom surface of the second gate structure, the second channel region including impurities having a fourth conductivity type different from the third conductivity type, and
   second source/drain regions at upper portions of the active fin adjacent to opposite sidewalls of the second gate structure, the second source/drain regions including impurities having the third conductivity type.

5. The semiconductor device as claimed in claim 1, wherein, when the first transistor is a PMOS transistor, the first metal pattern has a first work function, and when the first transistor is an NMOS transistor, the first metal pattern has a second work function greater then the first work function.

6. A semiconductor device, comprising:
   a substrate including an active fin and an isolation layer thereon;
   a first gate structure on the active fin, the first gate structure including a first gate insulation layer pattern and a first metal pattern, and the first metal pattern having a first conductivity type and directly contacting the first gate insulation layer pattern;
   a first channel region at a portion of the active fin facing a bottom surface of the first gate structure, the first channel region including impurities having the first conductivity type; and
   first source/drain regions at upper portions of the active fin adjacent to opposite sidewalls of the first gate structure, the first source/drain regions including impurities having a second conductivity type different from the first conductivity type,
   wherein the first gate structure, the first channel region, and the first source/drain regions define a first transistor, the first transistor being electrically connected to an input part or to an output part of a logic circuit to switch the logic circuit.

7. The semiconductor device as claimed in claim 6, wherein the logic circuit includes second transistors on a region of the substrate, wherein each of the second transistors includes:
   a second gate structure on the active fin, the second gate structure including the first gate insulation layer pattern and a second metal pattern, and the second metal pattern having a third conductivity type and directly contacting the first gate insulation layer pattern;
   a second channel region at a portion of the active fin facing a bottom surface of the second gate structure, the second channel region including impurities having a fourth conductivity type different from the third conductivity type; and
   second source/drain regions at upper portions of the active fin adjacent to opposite sidewalls of the second gate structure, the second source/drain regions including impurities having the third conductivity type.

8. The semiconductor device as claimed in claim 7, wherein:
   the first transistor is electrically connected to an input part of the logic circuit including the second transistors, the first transistor being a header transistor for switching the logic circuit.

9. The semiconductor device as claimed in claim 8, wherein:
   the first transistor includes the first gate structure, the first channel region, and the first source/drain regions,
   the first gate structure includes the first metal pattern having a n-type conductivity, the first channel region includes a n-type conductivity, and the first source/drain regions have p-type conductivities, and
   the first transistor is a PMOS transistor.

10. The semiconductor device as claimed in claim 7, wherein:
    the first transistor is electrically connected to an output part of the logic circuit including the second transistors, the first transistor being a footer transistor for switching the logic circuit.

11. The semiconductor device as claimed in claim 10, wherein:
    the first transistor includes the first gate structure, the first channel region, and the first source/drain regions,
    the first gate structure includes the first metal pattern having a p-type conductivity, the first channel region includes a p-type conductivity, and the first source/drain regions include n-type conductivities, and
    the first transistor is an NMOS transistor.

12. The semiconductor device as claimed in claim 7, wherein the second source/drain regions of the second transistor are in a semiconductor pattern defined by an epitaxial growth.

13. The semiconductor device as claimed in claim 6, wherein the first gate insulation layer pattern and the first metal pattern have a cylindrical shape.

14. The semiconductor device as claimed in claim 13, wherein the first gate structure further includes an upper metal pattern filling an inner space of the first metal pattern on the first metal pattern.

15. The semiconductor device as claimed in claim 6, wherein the first gate insulation layer pattern includes a silicon oxide layer pattern and a metal oxide layer pattern sequentially stacked.

16. The semiconductor device as claimed in claim 6, wherein the first gate structure has a gate length of about 10 nm to about 50 nm.

17. A semiconductor device, comprising:
    a substrate including an active fin and an isolation layer pattern thereon, the substrate being divided into first and second regions;
    a first transistor on the active fin of the first region, the first transistor including a first gate structure and a channel region, the first gate structure including a first gate insulation layer pattern and a first metal pattern, and each of the first metal pattern and the channel region having a first conductivity type;
    a second NMOS transistor on the active fin of the second region, the second NMOS transistor including a second gate structure with the first gate insulation layer pattern and a second metal pattern, the second metal pattern having a n-type metal; and
    a second PMOS transistor on the active fin of the second region, the second PMOS transistor including a third gate structure with the first gate insulation layer pattern and a third metal pattern, the third metal pattern having a p-type metal.

18. The semiconductor device as claimed in claim 17, wherein the first transistor is electrically connected to an input part of logic circuits including the second NMOS and PMOS transistors, the first transistor being a header transistor for switching the logic circuits.

19. The semiconductor device as claimed in claim 18, wherein:
- the first transistor includes the first gate structure, the channel region, and source/drain regions,
- the first gate structure includes the first metal pattern having a n-type conductivity, the channel region has a n-type conductivity, and the source/drain regions have p-type conductivities, and
- the first transistor is a PMOS transistor.

20. The semiconductor device as claimed in claim 17, wherein the first transistor is electrically connected to an output part of logic circuits including the second NMOS and PMOS transistors, the first transistor being a footer transistor for switching the logic circuits.

* * * * *